US012635168B2

(12) United States Patent
Dong et al.

(10) Patent No.: US 12,635,168 B2
(45) Date of Patent: May 19, 2026

(54) SEMICONDUCTOR DEVICE AND MANUFACTURING METHOD THEREOF

(71) Applicant: INNOSCIENCE (SUZHOU) SEMICONDUCTOR CO., LTD., Suzhou City (CN)

(72) Inventors: Zhiwen Dong, Zhuhai City (CN); Qiyue Zhao, Zhuhai City (CN); Shaopeng Cheng, Zhuhai City (CN)

(73) Assignee: INNOSCIENCE (SUZHOU) SEMICONDUCTOR CO., LTD., Suzhou City (CN)

( * ) Notice: Subject to any disclaimer, the term of this patent is extended or adjusted under 35 U.S.C. 154(b) by 824 days.

(21) Appl. No.: 17/801,516

(22) PCT Filed: Jun. 16, 2022

(86) PCT No.: PCT/CN2022/099135
§ 371 (c)(1),
(2) Date: Aug. 22, 2022

(87) PCT Pub. No.: WO2023/240529
PCT Pub. Date: Dec. 21, 2023

(65) Prior Publication Data
US 2024/0194772 A1 Jun. 13, 2024

(51) Int. Cl.
*H10D 8/60* (2025.01)
*H10D 30/01* (2025.01)
(Continued)

(52) U.S. Cl.
CPC ............. *H10D 30/475* (2025.01); *H10D 8/60* (2025.01); *H10D 30/015* (2025.01);
(Continued)

(58) Field of Classification Search
CPC .. H10D 64/513; H10D 64/258; H10D 64/256; H10D 30/475; H10D 30/015;
(Continued)

(56) References Cited

U.S. PATENT DOCUMENTS

| 5,929,467 A | 7/1999 | Kawai et al. | |
| 2014/0138697 A1* | 5/2014 | Lin ...................... | H10D 62/824 |
| | | | 438/572 |

(Continued)

FOREIGN PATENT DOCUMENTS

| CN | 104766882 A | 7/2015 |
| CN | 111937156 A | 11/2020 |
| CN | 112335039 A | 2/2021 |

OTHER PUBLICATIONS

R. Hentschel et al., "Pseudo-vertical GaN-based trench gate metal oxide semiconductor field effect transistor," 2016 11th International Conference on Advanced Semiconductor Devices & Microsystems (ASDAM), Smolenice, Slovakia, 2016, pp. 5-8, doi: 10.1109/ASDAM.2016.7805882. (Year: 2016).*

(Continued)

*Primary Examiner* — Zandra V Smith
*Assistant Examiner* — Emilio Ardeo
(74) *Attorney, Agent, or Firm* — Li & Cai Intellectual Property (USA) Office

(57) ABSTRACT

Some embodiments of the disclosure provide a semiconductor device. The semiconductor device comprises: a substrate; a first nitride semiconductor layer on the substrate; a second nitride semiconductor layer on the first nitride semiconductor layer and having a band gap greater than a band gap of the first nitride semiconductor layer; a dielectric layer disposed on the first nitride semiconductor layer and in direct contact with the first nitride semiconductor layer and the second nitride semiconductor layer; a gate electrode separated from the first nitride semiconductor layer and the second nitride semiconductor layer by the dielectric layer; a first conductive contact disposed on the first nitride semiconductor layer; and a second conductive contact disposed on the second nitride semiconductor layer; wherein the second conductive contact is formed between the gate electrode and the first conductive contact.

14 Claims, 17 Drawing Sheets

(51) Int. Cl.

| | |
|---|---|
| *H10D 30/47* | (2025.01) |
| *H10D 62/85* | (2025.01) |
| *H10D 64/23* | (2025.01) |
| *H10D 64/27* | (2025.01) |

(52) U.S. Cl.
CPC ......... *H10D 30/47* (2025.01); *H10D 62/8503* (2025.01); *H10D 64/254* (2025.01); *H10D 64/258* (2025.01); *H10D 64/513* (2025.01)

(58) Field of Classification Search
CPC .... H10D 30/47; H10D 64/254; H10D 64/411; H10D 84/05; H10D 84/811
See application file for complete search history.

(56) References Cited

U.S. PATENT DOCUMENTS

| | | | |
|---|---|---|---|
| 2015/0194512 A1 | 7/2015 | Ohki et al. | |
| 2015/0255547 A1* | 9/2015 | Yuan | ........................ H10D 8/60 |
| | | | 257/76 |
| 2017/0317184 A1 | 11/2017 | Hsu et al. | |
| 2021/0013333 A1 | 1/2021 | Yang | |

OTHER PUBLICATIONS

W. Saito, Y. Takada, M. Kuraguchi, K. Tsuda and I. Omura, "Recessed-gate structure approach toward normally off high-Voltage AlGaN/GaN HEMT for power electronics applications," in IEEE Transactions on Electron Devices, vol. 53, No. 2, pp. 356-362, Feb. 2006, doi: 10.1109/TED.2005.862708 (Year: 2006).*

H. Chandrasekar et al., "Dielectric Engineering of HfO2 Gate-Stacks for Normally-ON GaN HEMTs on 200-mm Silicon Sub-strates," in IEEE Transactions on Electron Devices, vol. 65, No. 9, pp. 3711-3718, Sep. 2018, doi: 10.1109/TED.2018.2856773 (Year: 2018).*

E. Y. Chang and Y.-K. Lin, "Ohmic Contacts with low contact resistance for GaN HEMTs, " 2019 19th International Workshop on Junction Technology (IWJT), Kyoto, Japan, 2019, pp. 1-2, doi: 10.23919/IWJT.2019.8802617. (Year: 2019).*

Hentschel et al., "Pseudo-vertical GaN-based trench gate metal oxide semiconductor field effect transistor", 2016 11th International Conference on Advanced Semiconductor Devices & Microsystems (ASDAM); doi: 10.1109/ASDAM.2016.7805882, 2016 (Year: 2016).*

ISA State Intellectual Property Office of the People's Republic of China, International Search Report Issued in Application No. PCT/CN2022/099135, Dec. 28, 2022, WIPO, 3 pages.

ISA State Intellectual Property Office of the People's Republic of China, Written Opinion of the International Searching Authority Issued in Application No. PCT/CN2022/099135, Dec. 28, 2022, WIPO, 4 pages.

* cited by examiner

SEMICONDUCTOR DEVICE AND MANUFACTURING METHOD THEREOF

BACKGROUND

1. Technical Field

The disclosure is related to a semiconductor device, and in particular, to a semiconductor device including a high-electron-mobility transistor (HEMT).

2. Description of the Related Art

A semiconductor component including a direct band gap, for example, a semiconductor component including a group III-V material or group III-V compounds, may operate or work under a variety of conditions or environments (for example, different voltages or frequencies) due to its characteristics.

The foregoing semiconductor component may include a HEMT, a heterojunction bipolar transistor (HBT), a heterojunction field effect transistor (HFET), or a modulation-doped field effect transistor (MODFET).

SUMMARY

Some embodiments of the disclosure provide a semiconductor device. The semiconductor device comprises: a substrate; a first nitride semiconductor layer on the substrate; a second nitride semiconductor layer on the first nitride semiconductor layer and having a band gap greater than a band gap of the first nitride semiconductor layer; a dielectric layer disposed on the first nitride semiconductor layer and in direct contact with the first nitride semiconductor layer and the second nitride semiconductor layer; a gate electrode separated from the first nitride semiconductor layer and the second nitride semiconductor layer by the dielectric layer; a first conductive contact disposed on the first nitride semiconductor layer; and a second conductive contact disposed on the second nitride semiconductor layer; wherein the second conductive contact is formed between the gate electrode and the first conductive contact.

Some embodiments of the disclosure provide a method for fabricating a semiconductor device. The method comprises: providing a substrate; forming a first nitride semiconductor layer on the substrate; forming a second nitride semiconductor layer having a band gap larger than a band gap of the first nitride semiconductor layer on the first nitride semiconductor layer; forming a dielectric layer on the first nitride semiconductor layer and in direct contact with the first nitride semiconductor layer and the second nitride semiconductor layer, and forming a gate electrode on the dielectric layer, wherein the dielectric layer includes an L-shape structure, and wherein the gate electrode is separated from the first nitride semiconductor layer and the second nitride semiconductor layer by the dielectric layer.

Some embodiments of the disclosure provide a semiconductor device. The semiconductor device comprises: a substrate; a first nitride semiconductor layer on the substrate; a second nitride semiconductor layer on the first nitride semiconductor layer and having a band gap greater than a band gap of the first nitride semiconductor layer; a dielectric layer disposed on the first nitride semiconductor layer and in direct contact with the first nitride semiconductor layer and the second nitride semiconductor layer; a gate electrode separated from the first nitride semiconductor layer and the second nitride semiconductor layer by the dielectric layer; a first conductive contact disposed on the first nitride semiconductor layer; a second conductive contact disposed on the second nitride semiconductor layer; and a third conductive contact surrounded by the second nitride semiconductor layer, wherein the second conductive.

BRIEF DESCRIPTION OF THE DRAWINGS

Aspects of the disclosure will become more comprehensible from the following detailed description made with reference to the accompanying drawings. It should be noted that, various features may not be drawn to scale. In fact, the sizes of the various features may be increased or reduced arbitrarily for the purpose of clear description.

DETAILED DESCRIPTION

Figure 1A:
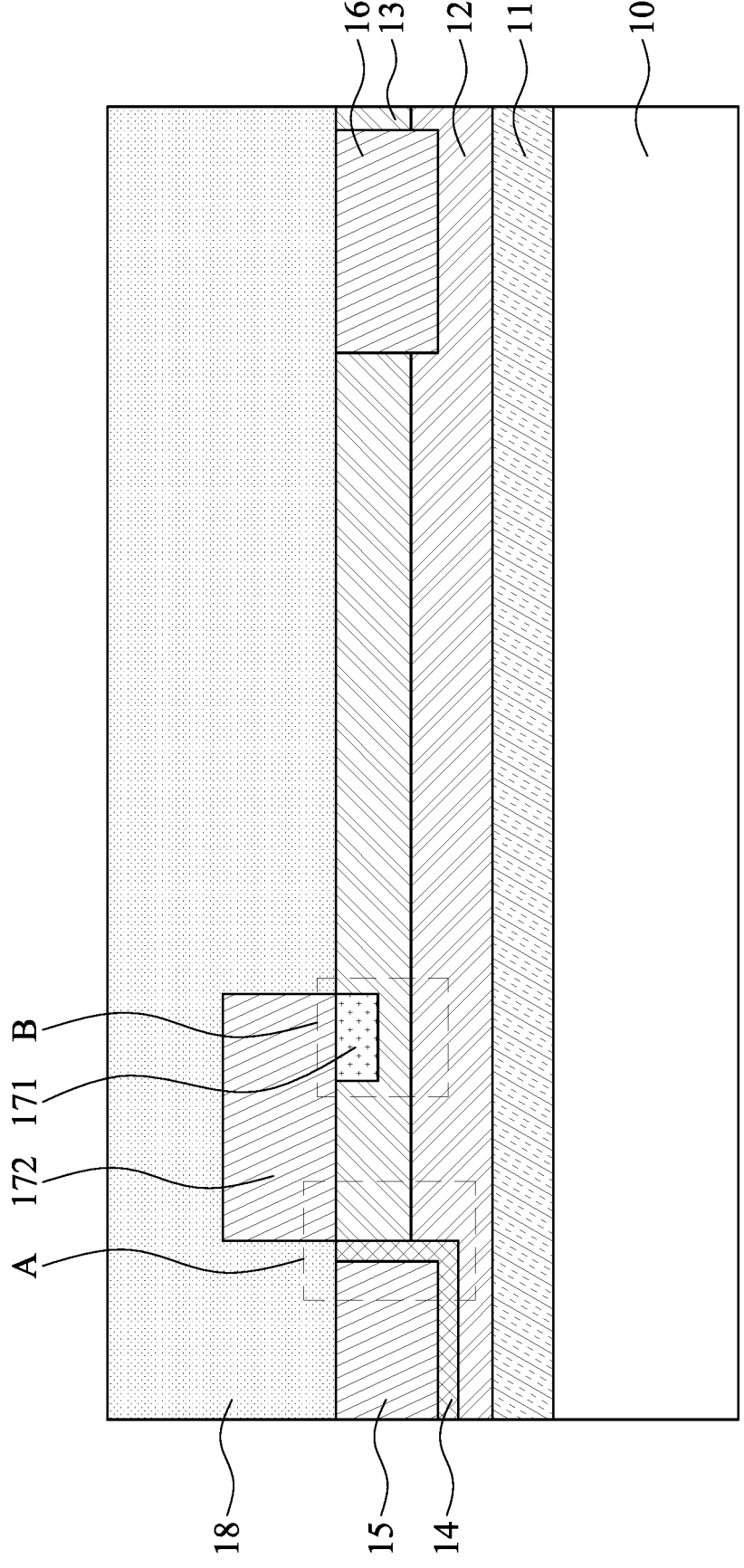
FIG. 1A is a side view of a semiconductor device according to some embodiments of the disclosure.

The following disclosure provides many different embodiments or examples for implementing different features of the provided subject matter. Specific examples of components and arrangements are described below. Certainly, these descriptions are merely examples and are not intended to be limiting. In the disclosure, in the following descriptions, the description of the first feature being formed on or above the second feature may include an embodiment in which the first feature and the second feature are formed to be in direct contact, and may further include an embodiment in which an additional feature may be formed between the first feature and the second feature to enable the first feature and the second feature to be not in direct contact. In addition, in the disclosure, reference numerals and/or letters may be repeated in examples. This repetition is for the purpose of simplification and clarity, and does not indicate a relationship between the described various embodiments and/or configurations.

The embodiments of the disclosure are described in detail below. However, it should be understood that many applicable concepts provided by the disclosure may be implemented in a plurality of specific environments. The described specific embodiments are only illustrative and do not limit the scope of the disclosure.

A direct band gap material, such as a group III-V compound, may include but is not limited to, for example, gallium arsenide (GaAs), indium phosphide (InP), gallium nitride (GaN), Indium gallium arsenide (InGaAs), Indium aluminum arsenide (InAlAs), and the like.

FIG. 1A is a side view of a semiconductor device 1 according to some embodiments of the disclosure.

As shown in FIG. 1A, the semiconductor device 1 may include a substrate 10, a buffer layer 11, a semiconductor layer 12, a semiconductor layer 13, a dielectric layer 14, a conductive structure 15, a conductive structure 16, a conductive structure 171, a conductive structure 172 and a passivation layer 18. The structure within the dotted rectangle A is further illustrated in FIG. 1B according to some embodiments of the disclosure. The structure within the dotted rectangle A is further illustrated in FIG. 1C according to some embodiments of the disclosure. The structure within the dotted rectangle B is further illustrated in FIG. 1D according to some embodiments of the disclosure. The structure within the dotted rectangle B is further illustrated in FIG. 1E according to some embodiments of the disclosure. The structure within the dotted rectangle B is further illustrated in FIG. 1F according to some embodiments of the disclosure.

The substrate 10 may include, for example, but is not limited to, silicon (Si), doped silicon (doped Si), silicon carbide (SiC), germanium silicide (SiGe), gallium arsenide (GaAs), or another semiconductor material. In some embodiments, the substrate 10 may include an intrinsic semiconductor material. In some embodiments, the substrate 10 may include a p-type semiconductor material. In some embodiments, the substrate 10 may include a silicon layer doped with boron (B). In some embodiments, the substrate 10 may include a silicon layer doped with gallium (Ga). In some embodiments, the substrate 10 may include an n-type semiconductor material. In some embodiments, the substrate 10 may include a silicon layer doped with arsenic (As). In some embodiments, the substrate 10 may include a silicon layer doped with phosphorus (P).

The buffer layer 11 may be disposed on the substrate 10. In some embodiments, the buffer layer 11 may include nitrides. In some embodiments, the buffer layer 11 may include, for example, but is not limited to, aluminum nitride (AlN). In some embodiments, the buffer layer 11 may include, for example, but is not limited to, aluminum gallium nitride (AlGaN). The buffer layer 11 may include a multilayer structure. The buffer layer 11 may include a superlattice layer with periodic structure of two or more materials. The buffer layer 11 may include a single layer structure.

The semiconductor layer 12 may be disposed on the buffer layer 11. The semiconductor layer 12 may include group III-V materials. The semiconductor layer 12 may be a nitride semiconductor layer. The semiconductor layer 12 may include, for example, but is not limited to, group III nitride. The semiconductor layer 12 may include, for example, but is not limited to, GaN. The semiconductor layer 12 may include, for example, but is not limited to, AlN. The semiconductor layer 12 may include, for example, but is not limited to, InN. The semiconductor layer 12 may include, for example, but is not limited to, compound $In_xAl_{-y}Ga_{1-x-y}N$, where $x+y≤1$. The semiconductor layer 12 may include, for example, but is not limited to, compound $Al_y Ga_{(1-y)} N$, where $y≤1$.

The semiconductor layer 13 may be disposed on the semiconductor layer 12. The semiconductor layer 13 may include group III-V materials. The semiconductor layer 13 may be a nitride semiconductor layer. The semiconductor layer 13 may include, for example, but is not limited to, group III nitride. The semiconductor layer 13 may include, for example, but is not limited to, compound $Al_yGa_{(1-y)}N$, where $y≤1$. The semiconductor layer 13 may include, for example, but is not limited to, GaN. The semiconductor layer 13 may include, for example, but is not limited to, AlN. The semiconductor layer 13 may include, for example, but is not limited to, InN. The semiconductor layer 13 may include, for example, but is not limited to, compound $In_xAl_yGa_{1-x-y}N$, where $x+y≤1$.

A heterojunction may be formed between the semiconductor layer 13 and the semiconductor layer 12. The semiconductor layer 13 may have a band gap greater than a band gap of the semiconductor layer 12. For example, the semiconductor layer 13 may include AlGaN that may have a band gap of about 4 eV, and the semiconductor layer 12 may include GaN that may have a band gap of about 3.4 eV.

In the semiconductor device 1, the semiconductor layer 12 may be used as a channel layer. In the semiconductor device 1, the semiconductor layer 12 may be used as a channel layer disposed on the buffer layer 11. In the semiconductor device 1, the semiconductor layer 13 may be used as a barrier layer. In the semiconductor device 1, the semiconductor layer 13 may be used as a barrier layer disposed on the semiconductor layer 12.

When the semiconductor layer 13 contacts the semiconductor layer 12, electrons will flow from the semiconductor layer 13 into the semiconductor layer 12, accumulate at the interface and form two dimensional electron gas (2DEG). In the semiconductor device 1, because the band gap of the semiconductor layer 12 is less than the band gap of the semiconductor layer 13, 2DEG may be formed in the semiconductor layer 12. In the semiconductor device 1, because the band gap of the semiconductor layer 12 is less than the band gap of the semiconductor layer 13, 2DEG may be formed in the semiconductor layer 12 and the 2DEG is close to the interface of the semiconductor layer 13 and the semiconductor layer 12. In the semiconductor device 1, because the band gap of the semiconductor layer 13 is greater than the band gap of the semiconductor layer 12, 2DEG may be formed in the semiconductor layer 12. In the semiconductor device 1, because the band gap of the semiconductor layer 13 is greater than the band gap of the semiconductor layer 12, 2DEG may be formed in the semiconductor layer 12 and the 2DEG is close to the interface of the semiconductor layer 13 and the semiconductor layer 12.

The dielectric layer 14 may be disposed on the semiconductor layer 12. The dielectric layer 14 may be in direct contact with the semiconductor layer 12. The dielectric layer 14 may be in direct contact with the semiconductor layer 13. The dielectric layer 14 may be in direct contact with the semiconductor layer 12 and the semiconductor layer 13. The dielectric layer 14 may separate the conductive structure 15 from the semiconductor layer 12. The dielectric layer 14 may separate the conductive structure 15 from the semiconductor layer 12 for forming a metal-insulator-semiconductor (MIS) structure. The dielectric layer 14 may separate the conductive structure 15 from the semiconductor layer 12 for reducing gate leakage. The dielectric layer 14 may separate the conductive structure 15 from the semiconductor layer 13. The dielectric layer 14 may separate the conductive structure 15 from the conductive structure 16. The dielectric layer 14 may separate the conductive structure 15 from the conductive structure 171. The dielectric layer 14 may separate the conductive structure 15 from the conductive structure 172. The dielectric layer 14 may include a high-k dielectric material. The dielectric layer 14 may include a high-k dielectric material for depleting the 2DEG in the semiconductor layer 12. The dielectric layer 14 may include a high-k dielectric material for depleting the 2DEG in the semiconductor layer 12 and adjacent to the dielectric layer 14. The dielectric layer 14 may include, for example, but is not limited to, hafnium oxide ($HfO_2$). The dielectric layer 14 may include, for example, but is not limited to, silicon nitride ($Si_3N_4$). The dielectric layer 14 may include, for example, but is not limited to, zirconium oxide ($ZrO_2$). The dielectric layer 14 may include, for example, but is not limited to, yttrium oxide ($Y_2O_3$). The dielectric layer 14 may electrically isolate the conductive structure 15. The dielectric layer 14 may electrically isolate the conductive structure 15 from the conductive structure 172. The dielectric layer 14 may have a thickness between approximately 1 nm and approximately 10 nm. The dielectric layer 14 may have a thickness between approximately 3 nm and approximately 8 nm. The dielectric layer 14 may have a thickness of about 5 nm.

The conductive structure 15 may be disposed on the semiconductor layer 12. The conductive structure 15 may be disposed on the dielectric layer 14. The conductive structure 15 may be in direct contact with the dielectric layer 14. The conductive structure 15 may be surrounded by the dielectric layer 14. The conductive structure 15 may be separated from the semiconductor layer 12. The conductive structure 15 may be separated from the semiconductor layer 12 by the dielectric layer 14. The conductive structure 15 may be separated from the semiconductor layer 13. The conductive structure 15 may be separated from the semiconductor layer 13 by the dielectric layer 14. The conductive structure 15 may be separated from the conductive structure 171. The conductive structure 15 may be separated from the conductive structure 171 by the dielectric layer 14. The conductive structure 15 may be separated from the conductive structure 172. The conductive structure 15 may be separated from the conductive structure 172 by the dielectric layer 14. The conductive structure 15 may be covered by the passivation layer 18. The conductive structure 15 may be overlaid by the passivation layer 18. The conductive structure 15 may be separated from the conductive structure 172 by the passivation layer 18. The conductive structure 15 may be a conductive contact. The conductive structure 15 may include a metal. The conductive structure 15 may include, for example, but is not limited to, gold (Au), platinum (Pt), titanium (Ti), palladium (Pd), nickel (Ni), or tungsten (W). The conductive structure 15 may include a metal compound. The conductive structure 15 may include, for example, but is not limited to, TiN.

In the semiconductor device 1, the conductive structure 15 may be used as a gate electrode. In the semiconductor device 1, the conductive structure 15 may be configured to control the 2DEG in the semiconductor layer 12. In the semiconductor device 1, a voltage may be applied to the conductive structure 15 to control the 2DEG in the semiconductor layer 12. In the semiconductor device 1, a voltage may be applied to the conductive structure 15 to control the 2DEG in the semiconductor layer 12 and below the conductive structure 13. In the semiconductor device 1, a voltage may be applied to the conductive structure 15 to control the 2DEG in the semiconductor layer 12 and adjacent to the dielectric layer 14. In the semiconductor device 1, a voltage may be applied to the conductive structure 15 to control the connection or disconnection between the conductive structure 16 and the conductive structure 172.

The conductive structure 16 may be disposed on the semiconductor layer 12. The conductive structure 16 may contact the semiconductor layer 12. The conductive structure 16 may be electrically connected to the semiconductor layer 12. The conductive structure 16 may be surrounded by the semiconductor layer 13. The conductive structure 16 may contact the semiconductor layer 13. The conductive structure 16 may be disposed on the semiconductor layer 13 (not shown in FIG. 1A). The conductive structure 16 may be electrically connected to the semiconductor layer 12 through the semiconductor layer 13. The conductive structure 16 may be covered by the passivation layer 18. The conductive structure 16 may be overlaid by the passivation layer 18. The conductive structure 16 may be a conductive contact. The conductive structure 16 may include a conductive material. The conductive structure 16 may include a metal. The conductive structure 16 may include, for example, but is not limited to, Al. The conductive structure 16 may include, for example, but is not limited to, Ti. The conductive structure 16 may include a metal compound. The conductive structure 16 may include, for example, but is not limited to, AlN. The conductive structure 16 may include, for example, but is not limited to, TiN.

The conductive structure 171 may be disposed on the semiconductor layer 12. The conductive structure 171 may be disposed on the semiconductor layer 13. The conductive structure 171 may contact the semiconductor layer 13. The conductive structure 171 may be in direct contact with the semiconductor layer 13. The conductive structure 171 may be surrounded by the semiconductor layer 13. The conductive structure 171 may be electrically connected to the semiconductor layer 12. The conductive structure 171 may be electrically connected to the semiconductor layer 12 through the semiconductor layer 13. The conductive structure 171 may be covered by the conductive structure 172. The conductive structure 171 may be overlaid by the conductive structure 172. The conductive structure 171 may contact the conductive structure 172. The conductive structure 171 may be in direct contact with the conductive structure 172. The conductive structure 171 may be covered by the passivation layer 18. The conductive structure 171 may be overlaid by the passivation layer 18. The conductive structure 171 may be disposed between the dielectric layer 14 and the conductive structure 16. The conductive structure 171 may be disposed between the conductive structure 15 and the conductive structure 16. The conductive structure 171 may be disposed between the dielectric layer 14 and the conductive structure 16 and closer to the dielectric layer 14. The conductive structure 171 may be disposed between the conductive structure 15 and the conductive structure 16 and closer to the conductive structure 15. The conductive structure 171 may be disposed between the semiconductor layer 12 and the conductive structure 171. The conductive structure 171 may be disposed between the semiconductor layer 13 and the conductive structure 171. The conductive structure 171 may be a conductive contact. The conductive structure 171 may include a conductive material. The conductive structure 171 may include a metal. The conductive structure 171 may include a metal with high work function. The conductive structure 171 may include, for example, but is not limited to, Ti. The conductive structure 171 may include, for example, but is not limited to, Au. The conductive structure 171 may include, for example, but is not limited to, Mo. The conductive structure 171 may include, for example, but is not limited to, Pt. The conductive structure 171 may include a metal compound. The conductive structure 171 may include, for example, but is not limited to, TiN. A Schottky barrier may be formed between the conductive structure 171 and the semiconductor layer 13. The conductive structure 171 and the semiconductor layer 13 may form a Schottky contact. The conductive structure 171 and the semiconductor layer 13 may form a Schottky diode. The conductive structure 171 and the semiconductor layer 13 may form a Schottky barrier diode.

The conductive structure 172 may be disposed on the semiconductor layer 12. The conductive structure 172 may be disposed on the semiconductor layer 13. The conductive structure 172 may contact the semiconductor layer 13. The conductive structure 172 may be in direct contact with the semiconductor layer 13. The conductive structure 172 may be electrically connected to the semiconductor layer 12. The conductive structure 172 may be electrically connected to the semiconductor layer 12 through the semiconductor layer 13. The conductive structure 172 may be disposed on the conductive structure 171. The conductive structure 172 may contact the conductive structure 171. The conductive structure 172 may be in direct contact with the conductive structure 171. The conductive structure 172 may be electrically connected to the conductive structure 171. The conductive structure 172 may be electrically connected to the semiconductor layer 12 through the conductive structure 171. The conductive structure 172 may be electrically connected to the semiconductor layer 12 through the conductive structure 171 and the semiconductor layer 13. The conductive structure 172 may be separated from the conductive structure 15. The conductive structure 172 may be separated from the conductive structure 15 by the dielectric layer 14. The conductive structure 172 may be covered by the passivation layer 18. The conductive structure 172 may be overlaid by the passivation layer 18. The conductive structure 172 may be separated from the conductive structure 15 by the passivation layer 18. The conductive structure 172 may be separated from the conductive structure 15 by the dielectric layer 14 and the passivation layer 18. The conductive structure 172 may be a conductive contact. The conductive structure 172 may include a conductive material. The conductive structure 172 may include a metal. The conductive structure 172 may include, for example, but is not limited to, Al. The conductive structure 172 may include, for example, but is not limited to, Ti. The conductive structure 172 may include a metal compound. The conductive structure 172 may include, for example, but is not limited to, AlN. The conductive structure 172 may include, for example, but is not limited to, TiN. The conductive structure 172 may include a material different from that of the conductive structure 171. The conductive structure 172 may include a material identical to that of the conductive structure 171. The conductive structure 172 may include a material same as that of the conductive structure 171.

The passivation layer 18 may be disposed on the semiconductor layer 13. The passivation layer 18 may extend on the semiconductor layer 13. The passivation layer 18 may cover the semiconductor layer 13. The passivation layer 18 may be disposed on the dielectric layer 14. The passivation layer 18 may cover the dielectric layer 14. The passivation layer 18 may be disposed on the conductive structure 15. The passivation layer 18 may cover the conductive structure 15. The passivation layer 18 may be disposed on the conductive structure 16. The passivation layer 18 may cover the conductive structure 16. The passivation layer 18 may be disposed on the conductive structure 171. The passivation layer 18 may cover the conductive structure 171. The passivation layer 18 may be disposed on the conductive structure 172. The passivation layer 18 may cover the conductive structure 172. The passivation layer 18 may separate the conductive structure 15 from the conductive structure 16. The passivation layer 18 may separate the conductive structure 15 from the conductive structure 171. The passivation layer 18 may separate the conductive structure 15 from the conductive structure 172. The passivation layer 18 may include a dielectric material. The passivation layer 18 may include a non-group III-V dielectric material. The passivation layer 18 may include nitride. The passivation layer 18 may include, for example, but is not limited to, silicon nitride ($Si_3N_4$). The passivation layer 18 may include oxide. The passivation layer 18 may include, for example, but is not limited to, silicon oxide ($SiO_2$). The passivation layer 18 may electrically isolate the conductive structure 15. The passivation layer 18 may electrically isolate the conductive structure 16. The passivation layer 18 may electrically isolate the conductive structure 171. The passivation layer 18 may electrically isolate the conductive structure 172.

The conductive structure 15 may be used as a gate electrode of the semiconductor device 1, the conductive structure 16 may be used as a drain electrode of the semiconductor device 1, and the conductive structure 172 may be used as a source electrode of the semiconductor device 1. Although the conductive structure 15 which may be used as a gate electrode and the conductive structure 16 which may be used as a drain electrode are respectively disposed on both sides of the conductive structure 172 which may be used as a source electrode in FIG. 1A, the conductive structure 15, the conductive structure 16, and the conductive structure 172 may be disposed differently in other embodiments of the disclosure according to design requirements. The conductive structure 15 may be used as a gate electrode of the semiconductor device 1, the conductive structure 16 may be used as a drain electrode of the semiconductor device 1, and the conductive structure 172 with the conductive structure 171 may be used as a source electrode of the semiconductor device 1. Although the conductive structure 15 which may be used as a gate electrode and the conductive structure 16 which may be used as a drain electrode are respectively disposed on both sides of the conductive structure 172 with the conductive structure 171 which may be used as a source electrode in FIG. 1A, the conductive structure 15, the conductive structure 16, and the conductive structure 172 with the conductive structure 171 may be disposed differently in other embodiments of the disclosure according to design requirements.

Figure 1B:
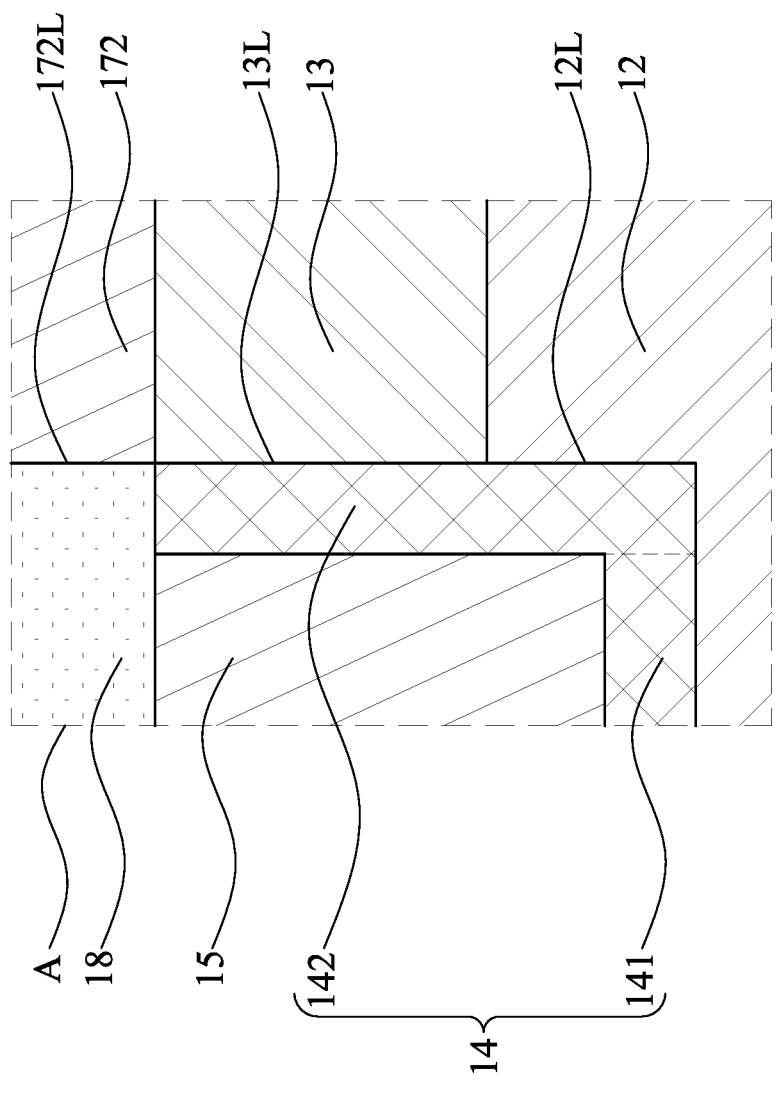
FIG. 1B is an enlarged side view of a semiconductor device according to some embodiments of the disclosure.

FIG. 1B is an enlarged side view of structure in the dotted rectangular A as shown in FIG. 1A according to some embodiments of the disclosure.

As shown in FIG. 1B, the semiconductor layer 12, the semiconductor layer 13, the dielectric layer 14, the conductive structure 15, the conductive structure 172, and the passivation layer 18 may be included in the dotted rectangular A.

The semiconductor layer 12 may have a sidewall 12L. The sidewall 12L may be vertical from the side view. The sidewall 12L may be in direct contact with the dielectric layer 14. The semiconductor layer 13 may have a sidewall 13L. The sidewall 13L may be vertical from the side view. The sidewall 13L may be in direct contact with the dielectric layer 14. The sidewall 12L may be aligned with the sidewall 13L.

The dielectric layer 14 may include a portion 141 and a portion 142. The portion 141 may be horizontal from the side view. The portion 141 may be in parallel with the semiconductor layer 12. The portion 141 may be in parallel with the semiconductor layer 13. The portion 141 may separate the semiconductor layer 12 from the conductive structure 15. The portion 141 may electrically isolate the conductive structure 15 from the semiconductor layer 12. The portion 141 may reduce leakage current. The portion 141 may reduce leakage current from the conductive structure 15. The portion 142 may be vertical from the side view. The portion 142 may be in perpendicular to the semiconductor layer 12. The portion 142 may be in perpendicular to the semiconductor layer 13. The portion 142 may separate the semiconductor layer 12 from the conductive structure 15. The portion 142 may electrically isolate the conductive structure 15 from the semiconductor layer 12. The portion 142 may separate the semiconductor layer 13 from the conductive structure 15. The portion 142 may electrically isolate the conductive structure 15 from the semiconductor layer 13. The portion 142 may be in direct contact with the sidewall 12L. The portion 142 may be in direct contact with the sidewall 13L. The portion 142 may be in direct contact with the sidewall 12L and the sidewall 13L. The portion 142 may reduce leakage current. The portion 142 may reduce leakage current from the conductive structure 15. The portion 141 may be perpendicular to the portion 142. The portion 141 and the portion 142 may form an L-shape structure. The portion 141 and the portion 142 may form a step shape structure. The dielectric layer 14 may include an L-shape structure. The dielectric layer 14 may include a step shape structure. A gate leakage current may be prevented if the conductive structure 15 which is used as a gate electrode is separated from the semiconductor layer 12 by the portion 141. A gate leakage current may be prevented if the conductive structure 15 which is used as a gate electrode is separated from the semiconductor layer 12 by the portion 142.

The conductive structure 172 may have a sidewall 172L. The sidewall 172L may be vertical from the side view. The sidewall 172L may be in direct contact with the passivation layer 18. The sidewall 172L may be aligned with the sidewall 12L. The sidewall 172L may be aligned with the sidewall 13L. The sidewall 172L may be aligned with the sidewall 12L and the sidewall 13L. The sidewall 172L may be separated from the conductive structure 15. The sidewall 172L may be separated from the conductive structure 15 by the dielectric layer 14. The sidewall 172L may be separated from the conductive structure 15 by the passivation layer 18. The sidewall 172L may be separated from the conductive structure 15 by the dielectric layer 14 and the passivation layer 18.

Figure 1C:
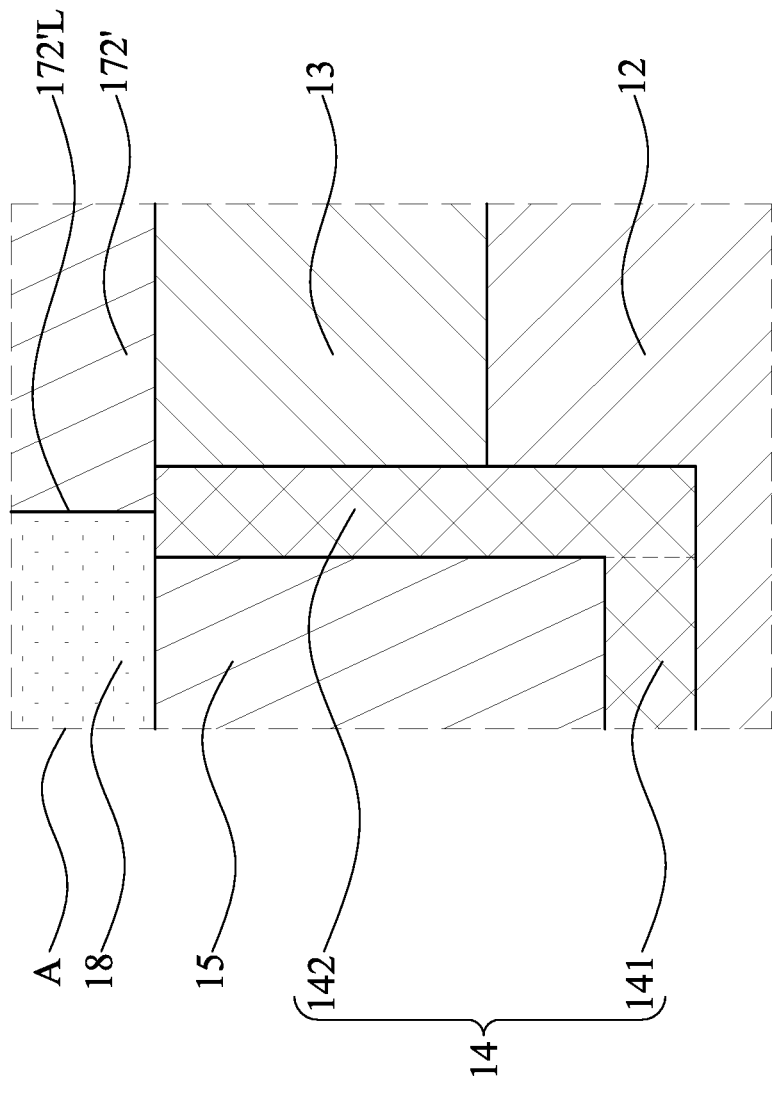
FIG. 1C is an enlarged side view of a semiconductor device according to some embodiments of the disclosure.

FIG. 1C is an enlarged side view of structure in the dotted rectangular A as shown in FIG. 1A according to some embodiments of the disclosure.

FIG. 1C is similar to FIG. 1B, but differs in that the conductive structure 172 shown in FIG. 1B is replaced by the conductive structure 172'. The conductive structure 172' may be different from the conductive structure 172.

The conductive structure 172' may be disposed on the semiconductor layer 12. The conductive structure 172' may be disposed on the semiconductor layer 13. The conductive structure 172' may contact the semiconductor layer 13. The conductive structure 172' may be in direct contact with the semiconductor layer 13. The conductive structure 172' may be disposed on the dielectric layer 14. The conductive structure 172' may contact the dielectric layer 14. The conductive structure 172' may be disposed on the portion 142. The conductive structure 172' may contact the portion 142.

The conductive structure 172' may have a sidewall 172'L. The sidewall 172'L may be vertical from the side view. The sidewall 172'L may be in direct contact with the passivation layer 18. The sidewall 172'L may be disposed on the dielectric layer 14. The sidewall 172'L may be disposed on the portion 142. The sidewall 172'L may be in direct contact with the passivation layer 18. The sidewall 172'L may be separated from the conductive structure 15. The sidewall 172'L may be separated from the conductive structure 15 by the dielectric layer 14. The sidewall 172'L may be separated from the conductive structure 15 by the passivation layer 18. The sidewall 172'L may be separated from the conductive structure 15 by the dielectric layer 14 and the passivation layer 18.

Figure 1D:
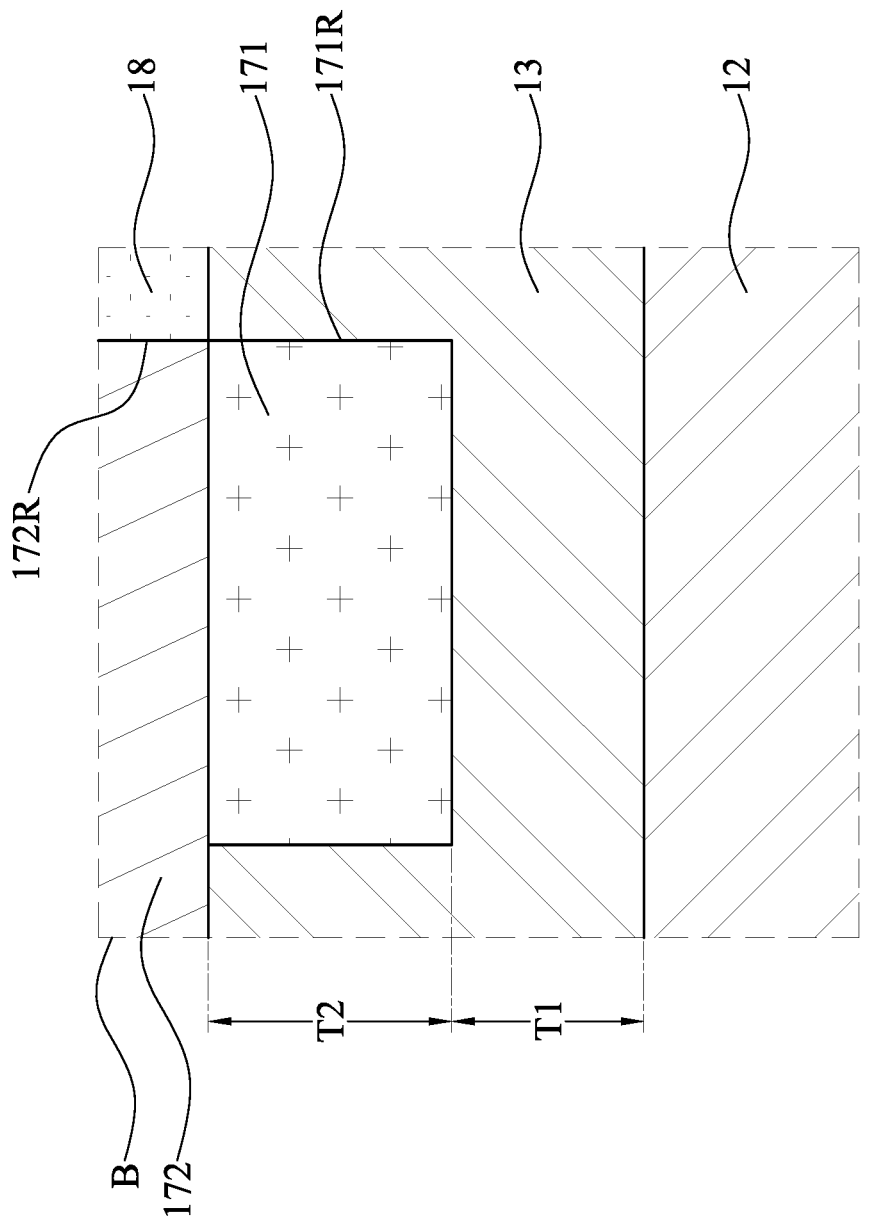
FIG. 1D is an enlarged side view of a semiconductor device according to some embodiments of the disclosure.

FIG. 1D is an enlarged side view of structure in the dotted rectangular B as shown in FIG. 1A according to some embodiments of the disclosure.

As shown in FIG. 1D, the semiconductor layer 12, the semiconductor layer 13, the conductive structure 171, the conductive structure 172, and the passivation layer 18 may be included in the dotted rectangular B.

The conductive structure 171 may be surrounded by the semiconductor layer 13 and covered by the conductive structure 172. The conductive structure 171 may be surrounded by the semiconductor layer 13 and overlaid by the conductive structure 172. The conductive structure 171 may have a sidewall 171R. The sidewall 171R may be vertical from the side view. The sidewall 171R may be in direct contact with the semiconductor layer 13. The conductive structure 172 may have a sidewall 172R. The sidewall 172R may be vertical from the side view. The sidewall 172R may be in direct contact with the passivation layer 18. The sidewall 171R may be aligned with the sidewall 172R.

The semiconductor layer 13 may have a thickness T1. The thickness T1 may include a distance between the semiconductor layer 12 and the conductive structure 171. The thickness T1 may include a distance between an interface of the semiconductor layer 12 and the semiconductor layer 13 and an interface of the conductive structure 171 and the semiconductor layer 13. The thickness T1 may be less than 100 nm. The thickness T1 may be no greater than 100 nm. The thickness T1 may be less than 50 nm. The thickness T1 may be no greater than 50 nm. The thickness T1 may range between approximately 5 nm and approximately 20 nm. The thickness T1 may range between approximately 10 nm and approximately 15 nm.

The conductive structure 171 may have a thickness T2. The thickness T2 may include a distance between the semiconductor layer 13 and the conductive structure 172. The thickness T2 may include a distance between an interface of the semiconductor layer 13 and the conductive structure 171 and an interface of the conductive structure 172 and the conductive structure 171. The thickness T2 may be greater than 100 nm. The thickness T2 may be no less than 100 nm. The thickness T2 may be greater than 50 nm. The thickness T2 may be no less than 50 nm. The thickness T2 and the thickness T1 may be equal. The thickness T2 may be greater than the thickness T1. The thickness T1 may be smaller than the thickness T2.

It should be noted that, the conductive structure 171 and the semiconductor layer 13 may form a metal-semiconductor junction with rectifying characteristics. The conductive structure 171 and the semiconductor layer 13 may form a Schottky barrier. The conductive structure 171 and the semiconductor layer 13 may form a Schottky barrier with rectification.

Figure 1E:
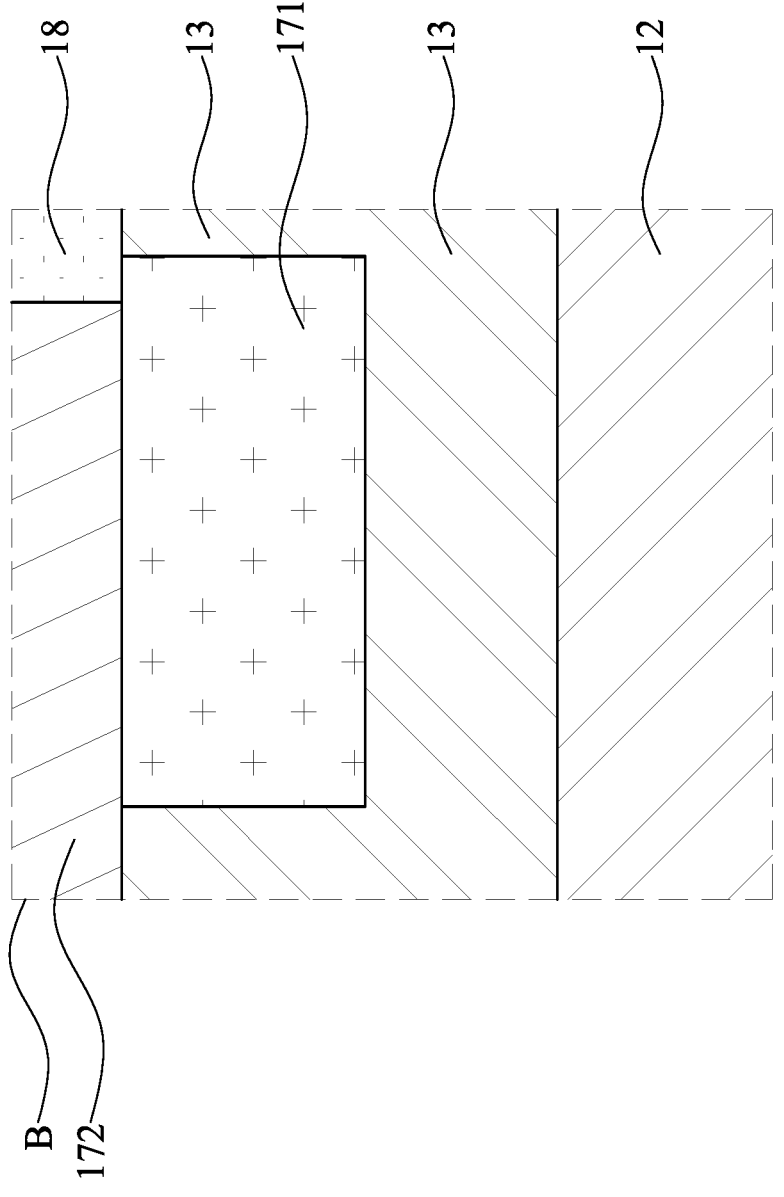
FIG. 1E is an enlarged side view of a semiconductor device according to some embodiments of the disclosure.

FIG. 1E is an enlarged side view of structure in the dotted rectangular B as shown in FIG. 1A according to some embodiments of the disclosure.

FIG. 1E is similar to FIG. 1D, but differs in that the conductive structure 171 shown in FIG. 1D is replaced by the conductive structure 171'. The conductive structure 171' may be different from the conductive structure 171.

The conductive structure 171' may be disposed on the semiconductor layer 12. The conductive structure 171' may be disposed on the semiconductor layer 13. The conductive structure 171' may contact the semiconductor layer 13. The conductive structure 171' may be in direct contact with the semiconductor layer 13. The conductive structure 171' may be surrounded by the semiconductor layer 13. The conductive structure 171' may be covered by the conductive structure 172. The conductive structure 171' may be overlaid by the conductive structure 172. The conductive structure 171' may be covered by the passivation layer 18. The conductive structure 171' may be overlaid by the passivation layer 18. The conductive structure 171' may be covered by the conductive structure 172 and the passivation layer 18. The conductive structure 171' may be overlaid by the conductive structure 172 and the passivation layer 18. The conductive structure 171' may be in direct contact with the conductive structure 172. The conductive structure 171' may extend toward the conductive structure 16 as shown in FIG. 1A. A portion of the conductive structure 171' may be in direct contact with the passivation layer 18. A portion of the conductive structure 171' is not overlaid by the conductive structure 172.

Figure 1F:
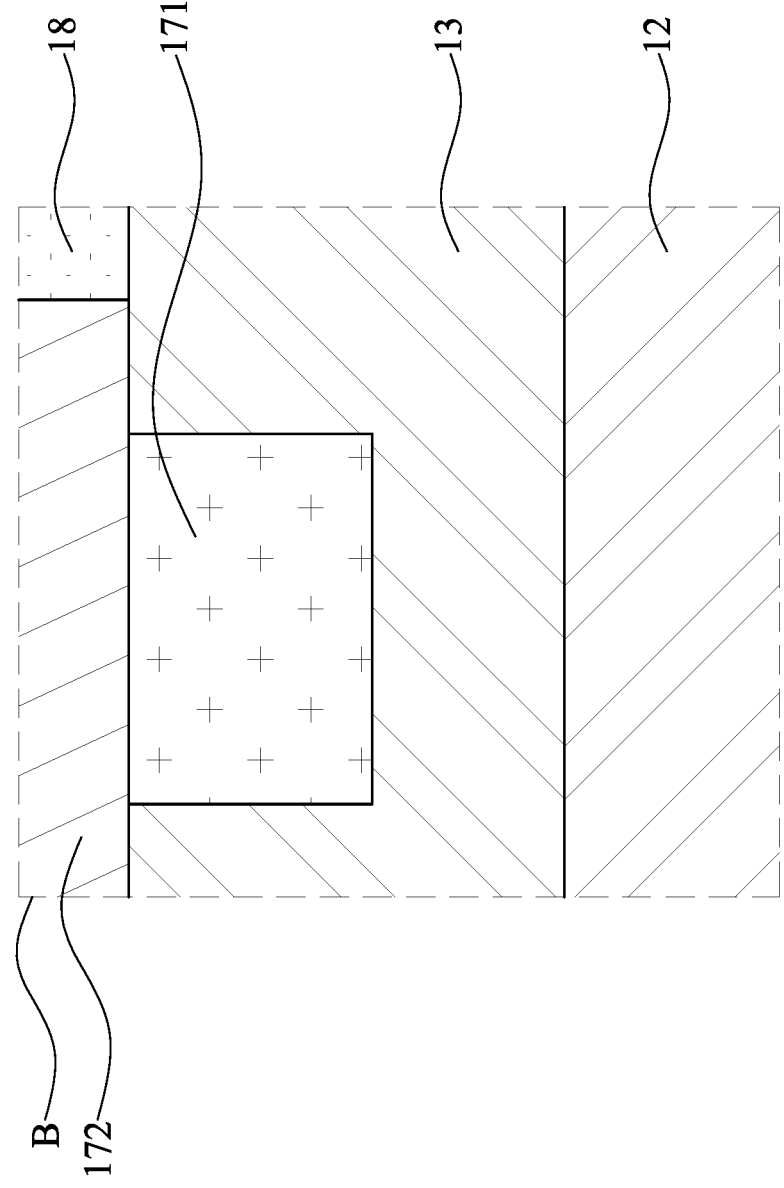
FIG. 1F is an enlarged side view of a semiconductor device according to some embodiments of the disclosure.

FIG. 1F is an enlarged side view of structure in the dotted rectangular B as shown in FIG. 1A according to some embodiments of the disclosure.

FIG. 1F is similar to FIG. 1D, but differs in that the conductive structure 171 shown in FIG. 1D is replaced by the conductive structure 171". The conductive structure 171" may be different from the conductive structure 171.

The conductive structure 171" may be disposed on the semiconductor layer 12. The conductive structure 171" may be disposed on the semiconductor layer 13. The conductive structure 171" may contact the semiconductor layer 13. The conductive structure 171" may be in direct contact with the semiconductor layer 13. The conductive structure 171" may be surrounded by the semiconductor layer 13. The conductive structure 171" may be covered by the conductive structure 172. The conductive structure 171" may be overlaid by the conductive structure 172. The conductive structure 171" may be entirely covered by the conductive structure 172. The conductive structure 171" may be completely overlaid by the conductive structure 172. The conductive structure 171" may be in direct contact with the conductive structure 172.

Figure 2A:
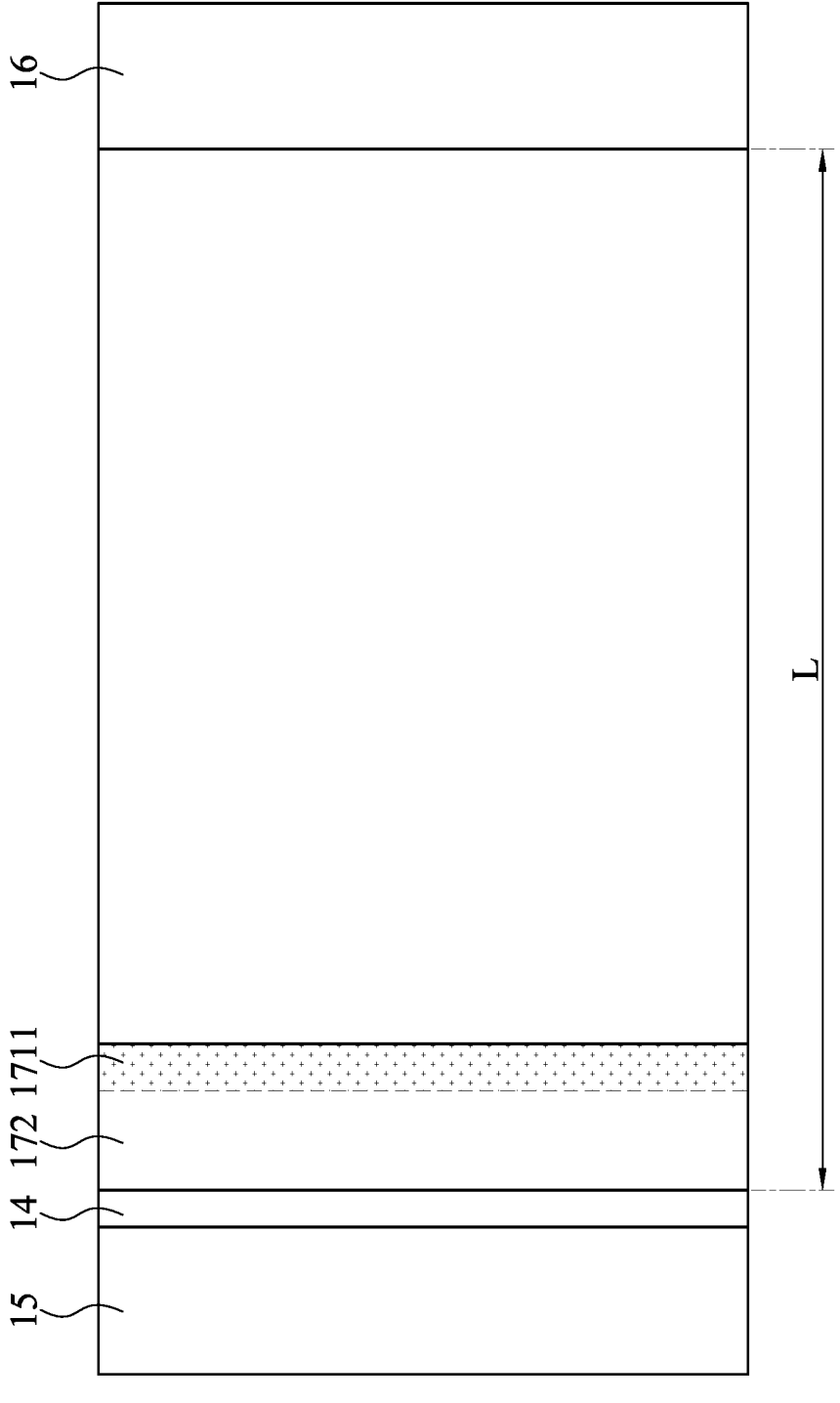
FIG. 2A is a top view of a semiconductor device according to some embodiments of the disclosure.

FIG. 2A is a top view of a semiconductor device 2 according to some embodiments of the disclosure.

As shown in FIG. 2A, the semiconductor device 2 may include a dielectric layer 14, a conductive structure 15, a conductive structure 16, a conductive structure 1711, and a conductive structure 172.

The conductive structure 1711 may include a rectangular shape from the top view. The conductive structure 1711 may include a substantially rectangular shape from the top view. The conductive structure 1711 may include a cuboid structure. The conductive structure 1711 may include a substantially cuboid structure. The conductive structure 1711 may be under the conductive structure 172. The conductive structure 1711 may be beneath the conductive structure 172. The conductive structure 1711 may be in direct contact with the conductive structure 172. The conductive structure 1711 may be closer to the conductive structure 15 than the conductive structure 16.

The distance between the dielectric layer 14 and the conductive structure 16 may be defined as a length L. The length L may be regarded as a length between the conductive structure 15 and the conductive structure 16. The length L may be regarded as a length between a gate electrode and a drain electrode ($L_{gd}$). In a conventional semiconductor device, a gate electrode is disposed between a drain electrode and a source electrode; in the semiconductor device 2, the length L may be greater than the distance between the gate electrode and the drain electrode of the conventional semiconductor device. Under the same dimension of device structures, since the semiconductor device 2 compared with the conventional semiconductor device includes a greater length L, the semiconductor device 2 may withstand a higher voltage during operations. The length L may be greater than 200 nm. The length L may be greater than 500 nm. The length L may be greater than 1000 nm.

Figure 2B:
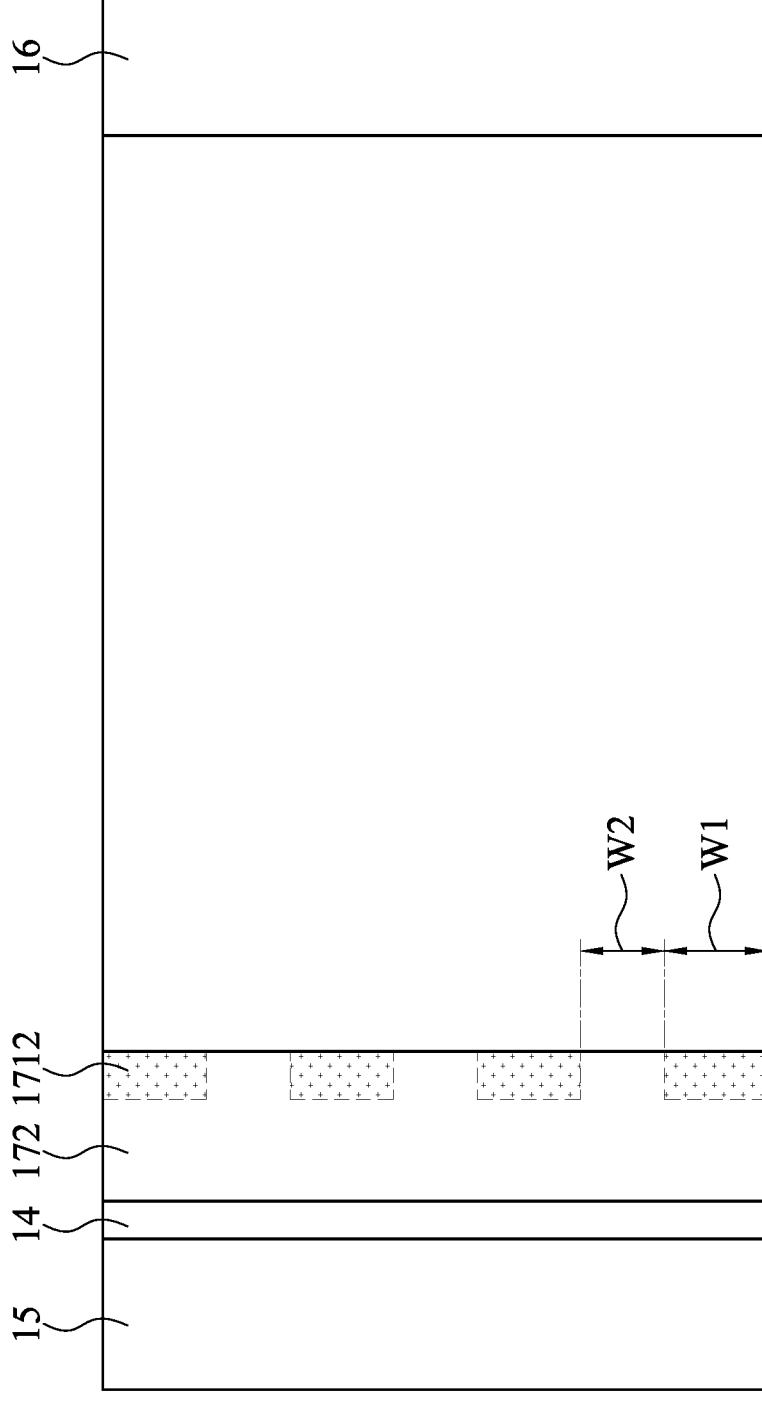
FIG. 2B is a top view of a semiconductor device according to some embodiments of the disclosure.

FIG. 2B is a top view of a semiconductor device 2 according to some embodiments of the disclosure.

As shown in FIG. 2B, the semiconductor device 2 may include a dielectric layer 14, a conductive structure 15, a conductive structure 16, a conductive structure 1712, and a conductive structure 172.

The conductive structure 1712 may include two or more rectangular shapes from the top view. The conductive structure 1712 may include a plurality of rectangular shapes from the top view. The conductive structure 1712 may include two or more island structures. The conductive structure 1712 may include a plurality of island structures. The conductive structure 1712 may include two or more blocky structures. The conductive structure 1712 may include a plurality of blocky structures. The conductive structure 1712 may be under the conductive structure 172. The conductive structure 1712 may be beneath the conductive structure 172. The conductive structure 1712 may be in direct contact with the conductive structure 172. The conductive structure 1712 may be closer to the conductive structure 15 than the conductive structure 16.

The conductive structure 1712 may include a blocky structure with a width W1. The distance between two adjacent blocky structures may be defined as a width W2. The conductive structure 1712 may include an island structure with a width W1. The distance between two adjacent island structures may be defined as a width W2. The width W1 may range between approximately 100 nm and approximately 300 nm. The width W1 may range between approximately 150 nm and approximately 250 nm. The width W2 may range between approximately 50 nm and approximately 250 nm. The width W2 may range between approximately 100 nm and approximately 200 nm.

The conductive structure 1711 in FIG. 2A may correspond to the conductive structure 171 in FIG. 1A. The conductive structure 1711 with a substantially cuboid structure may cause a higher effective current density when the Schottky diode functions. The conductive structure 1711 with a substantially cuboid structure may cause a lower current density when the HEMT functions. The conductive structure 1712 in FIG. 2B may correspond to the conductive structure 171 in FIG. 1A. The conductive structure 1712 with a plurality of island structures may cause a higher effective current density when the HEMT functions. The conductive structure 1712 with a plurality of island structures may cause a lower current density when the Schottky diode functions.

Figure 3A:
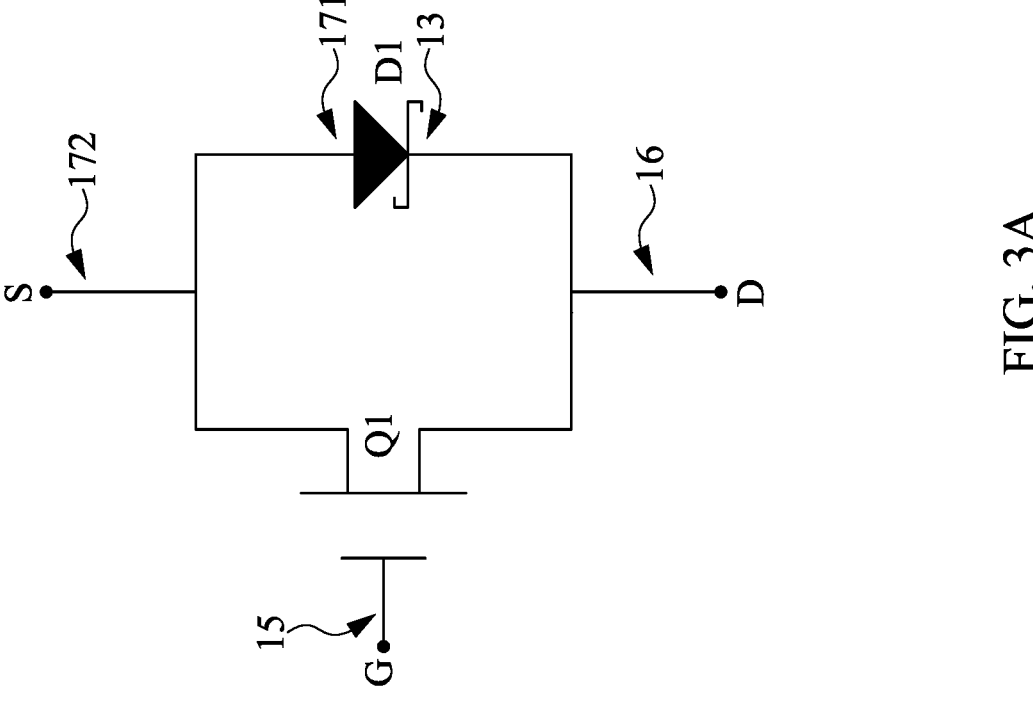
FIG. 3A is a circuit diagram of a circuit comprising a transistor and a diode according to some embodiments of the disclosure.

FIG. 3A is an illustrative circuit diagram of a circuit 3 according to some embodiments of the disclosure.

As shown in FIG. 3A, the circuit 3 may include a transistor Q1 and a diode D1. The transistor Q1 may include a gate terminal G, a drain terminal D, and a source terminal S. The gate terminal G may include a conductive structure 15. The drain terminal D may include a conductive structure 16. The source terminal S may include a conductive structure 172. The source terminal S may include a conductive structure 171. The source terminal S may include a conductive structure 172 and a conductive structure 171. The transistor Q1 may include an HEMT. The transistor Q1 may include an enhancement mode (E-mode) HEMT. The diode D1 may include an anode and a cathode. The anode may include a conductive structure 171. The anode may include a conductive structure 172. The anode may include a conductive structure 171 and a conductive structure 172. The cathode may include a semiconductor layer 13. The diode D1 may include a Schottky diode. The transistor Q1 and the diode D1 may be integrated on a single chip. The transistor Q1 and the diode D1 may be formed on a single chip. The transistor Q1 and the diode D1 may be integrated on a single GaN chip. The transistor Q1 and the diode D1 may be formed on a single GaN chip. The circuit 3 may be embodied based on the semiconductor device 1 as shown in FIG. 1A. The circuit 3 including the transistor Q1 and the diode D1 may be embodied based on the semiconductor device 1 as shown in FIG. 1A.

Figure 3B:
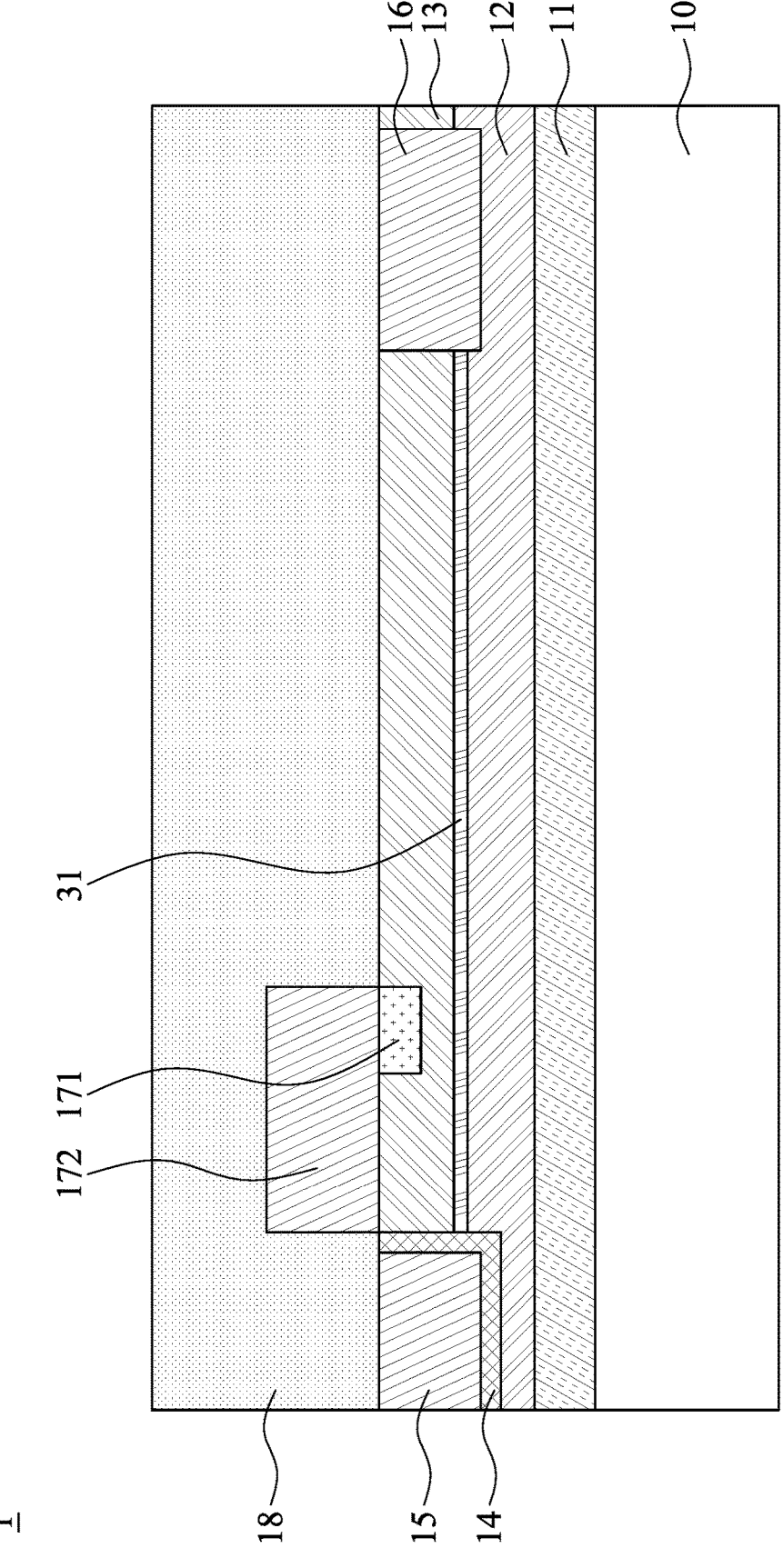
FIG. 3B is a side view of a semiconductor device during operations according to some embodiments of the disclosure.

FIG. 3B is a side view of a semiconductor device 1 during operations according to some embodiments of the disclosure.

As shown in FIG. 3B, the semiconductor device 1 may include a substrate 10, a buffer layer 11, a semiconductor layer 12, a semiconductor layer 13, a dielectric layer 14, a conductive structure 15, a conductive structure 16, a conductive structure 171, a conductive structure 172 and a passivation layer 18.

When a voltage greater than a threshold voltage is applied to the conductive structure 15, a 2DEG channel 31 may be formed in the semiconductor layer 12. The 2DEG channel 31 may be formed in the semiconductor layer 12 and adjacent to the dielectric layer 14. The 2DEG channel 31 may extend from the dielectric layer 14 to the conductive structure 16.

When a voltage greater than a threshold voltage is applied to the conductive structure 15 and a positive voltage is applied to the conductive structure 16, a current may flow from the conductive structure 16 to the conductive structure 172.

When a voltage greater than a threshold voltage is applied to the conductive structure 15 and a positive voltage is applied to the conductive structure 16, and no bias is applied to the conductive structure 172, a current may flow from the conductive structure 16 to the conductive structure 172.

When a voltage greater than a threshold voltage is applied to the conductive structure 15 and a positive voltage is applied to the conductive structure 16, and no bias is applied to the conductive structure 172, a current may flow from the conductive structure 16 to the conductive structure 172 via the semiconductor layer 12 and the semiconductor layer 13.

When a voltage greater than a threshold voltage is applied to the conductive structure 15 and a positive voltage is applied to the conductive structure 16, and no bias is applied to the conductive structure 172, a current may flow from the conductive structure 16 to the conductive structure 172 via the 2DEG channel 31.

During the operation mode as shown in FIG. 3B, the semiconductor device 1 may function as a transistor. The semiconductor device 1 may function as an HEMT. The semiconductor device 1 may function as an E-mode HEMT.

Figure 3C:
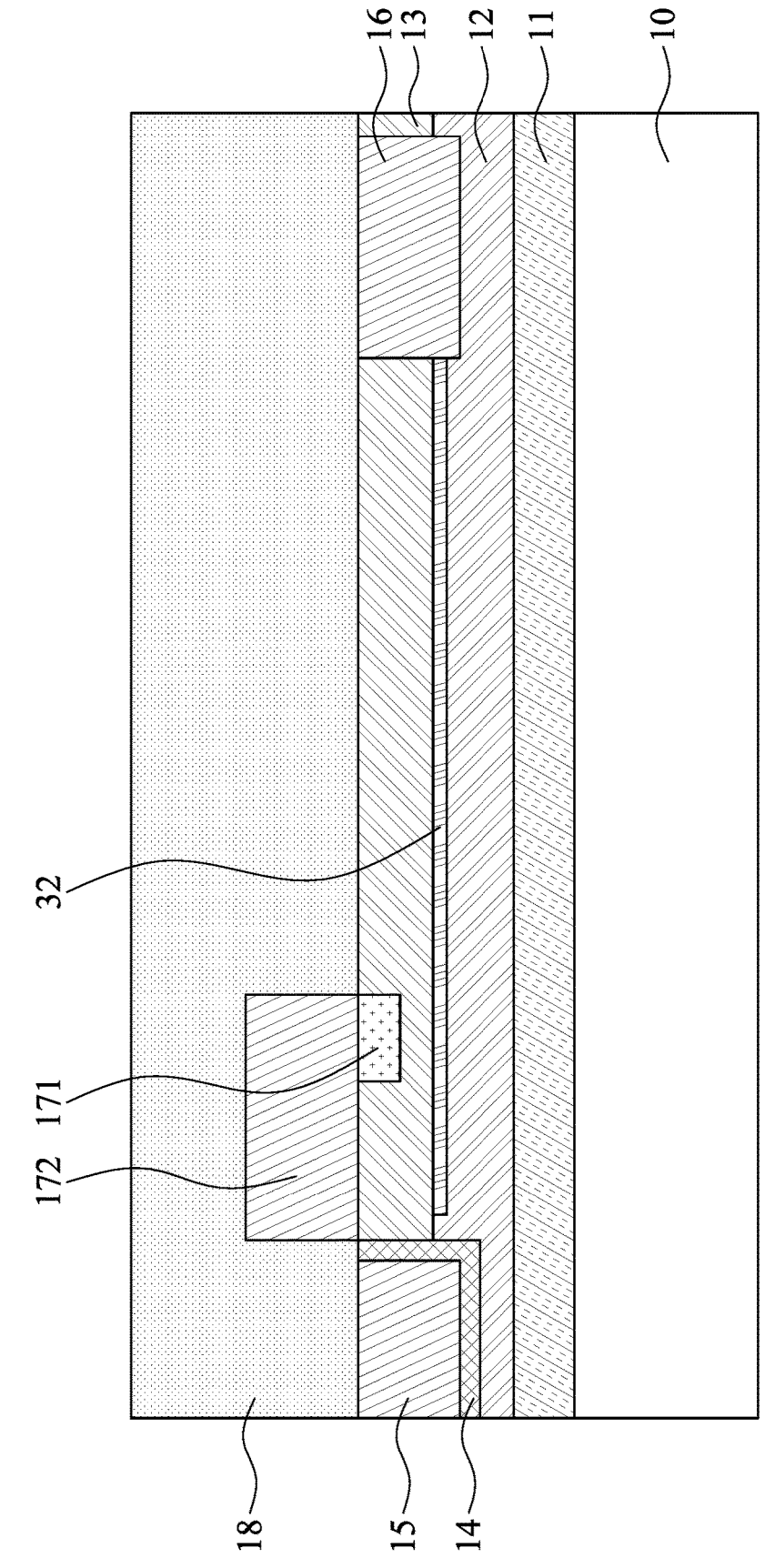
FIG. 3C is a side view of a semiconductor device during operations according to some embodiments of the disclosure.

FIG. 3C is a side view of a semiconductor device 1 during operations according to some embodiments of the disclosure.

As shown in FIG. 3C, the semiconductor device 1 may include a substrate 10, a buffer layer 11, a semiconductor layer 12, a semiconductor layer 13, a dielectric layer 14, a conductive structure 15, a conductive structure 16, a conductive structure 171, a conductive structure 172 and a passivation layer 18.

When no bias is applied to the conductive structure 15, a 2DEG channel 32 may be formed in the semiconductor layer 12. The 2DEG channel 32 may be formed in the semiconductor layer 12 but absent from the region adjacent to the dielectric layer 14. The 2DEG channel 32 may be formed in the semiconductor layer 12 but absent near the dielectric layer 14.

When no bias is applied to the conductive structure 16, and a positive voltage is applied to the conductive structure 172, a current may flow from the conductive structure 172 to the conductive structure 16.

When no bias is applied to the conductive structure 15 or the conductive structure 16, and a positive voltage is applied to the conductive structure 172, a current may flow from the conductive structure 172 to the conductive structure 16.

When no bias is applied to the conductive structure 15 or the conductive structure 16, and a positive voltage is applied to the conductive structure 172, a current may flow from the conductive structure 172 to the conductive structure 16 via the semiconductor layer 13 and the semiconductor layer 12.

When no bias is applied to the conductive structure 15 or the conductive structure 16, and a positive voltage is applied to the conductive structure 172, a current may flow from the conductive structure 172 to the conductive structure 16 via the conductive structure 171, the semiconductor layer 13 and the semiconductor layer 12.

When no bias is applied to the conductive structure 15 or the conductive structure 16, and a positive voltage is applied to the conductive structure 172, a current may flow from the conductive structure 172 to the conductive structure 16 via the 2DEG channel 32.

During the operation mode as shown in FIG. 3C, the semiconductor device 1 may function as a diode. The semiconductor device 1 may function as a Schottky diode.

Referring to FIGS. 3A, 3B and 3C, a diode may be integrated with a transistor on a single chip. The diode may include a Schottky diode. The Schottky diode may include the conductive structure 171, the conductive structure 172, and the semiconductor layer 13. The transistor may include an E-mode HEMT. The E-mode HEMT may include a source terminal. The source terminal may include the conductive structure 171 and the conductive structure 172. The single chip may include a GaN chip. The E-mode HEMT may include a gate terminal and a drain terminal. The source terminal may be disposed between the gate terminal and the drain terminal. The source terminal may be disposed between the gate terminal and the drain terminal and closer to the gate terminal than the drain terminal. During the forward bias operation as shown in FIG. 3B, the E-mode HEMT may function. During the reverse bias operation as shown in FIG. 3C, the Schottky diode may function. It should be noted that based on the arrangement of the semiconductor structure, the transistor and the diode integrated on a single chip may be embodied. The E-mode HEMT and the Schottky diode integrated on a single GaN chip may be embodied. The E-mode HEMT and the Schottky diode integrated on a single GaN chip may be used for power devices. The E-mode HEMT and the Schottky diode integrated on a single GaN chip may be used for a high power and high efficiency amplifier. The E-mode HEMT and the Schottky diode integrated on a single GaN chip may be used for a high-power switching device. Since the Schottky diode is integrated with the E-mode HEMT on a single GaN chip, parasitic capacitance and parasitic inductance may be reduced. The volume of the chip may be sufficiently used and the device may be scaled down.

FIG. 4A, FIG. 4B, FIG. 4C, FIG. 4D, FIG. 4E, and FIG. 4F show several operations for manufacturing the semiconductor device 1 as shown in FIG. 1A.

Figure 4A:
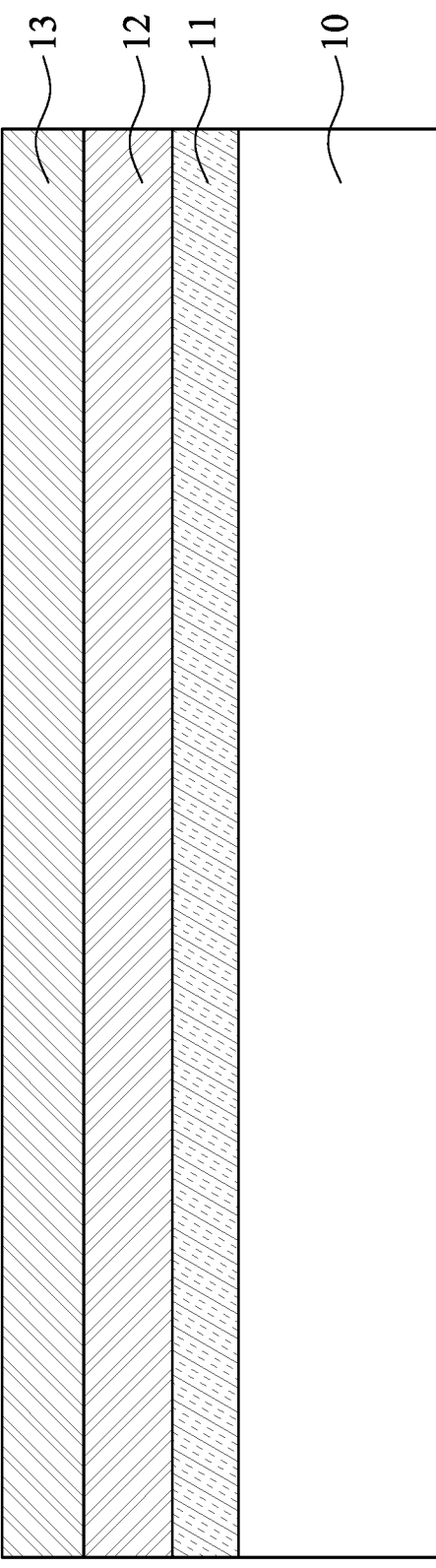
FIG. 4A, FIG. 4B, FIG. 4C, FIG. 4D, FIG. 4E, and FIG. 4F show several operations for manufacturing a semiconductor device according to some embodiments of the disclosure.

Referring to FIG. 4A, a substrate 10 may be provided. A buffer layer 11 may be formed on the substrate 10. The buffer layer 11 may be formed through chemical vapor deposition (CVD) and/or another suitable deposition step. The buffer layer 11 may be formed on the substrate 10 through CVD and/or another suitable deposition step. A semiconductor layer 12 may be formed on the buffer layer 11. The semiconductor layer 12 may be formed through CVD and/or another suitable deposition step. The semiconductor layer 12 may be formed on the buffer layer 11 through CVD and/or another suitable deposition step. A semiconductor layer 13 may be formed on the semiconductor layer 12. The semiconductor layer 13 may be formed through CVD and/or another suitable deposition step. The semiconductor layer 13 may be formed on the semiconductor layer 12 through CVD and/or another suitable deposition step.

It should be noted that, the semiconductor layer 13 may be formed after forming the semiconductor layer 12. A heterojunction may be formed when the semiconductor layer 13 is disposed on the semiconductor layer 12. A band gap of the semiconductor layer 13 may be greater than a band gap of the semiconductor layer 12. Due to the polarization phenomenon of the formed heterojunction between the semiconductor layer 13 and the semiconductor layer 12, 2DEG may be formed in the semiconductor layer 12. Due to the polarization phenomenon of the formed heterojunction between the semiconductor layer 13 and the semiconductor layer 12, 2DEG may be formed in the semiconductor layer 12 and close to an interface between the semiconductor layer 12 and the semiconductor layer 13.

Figure 4B:
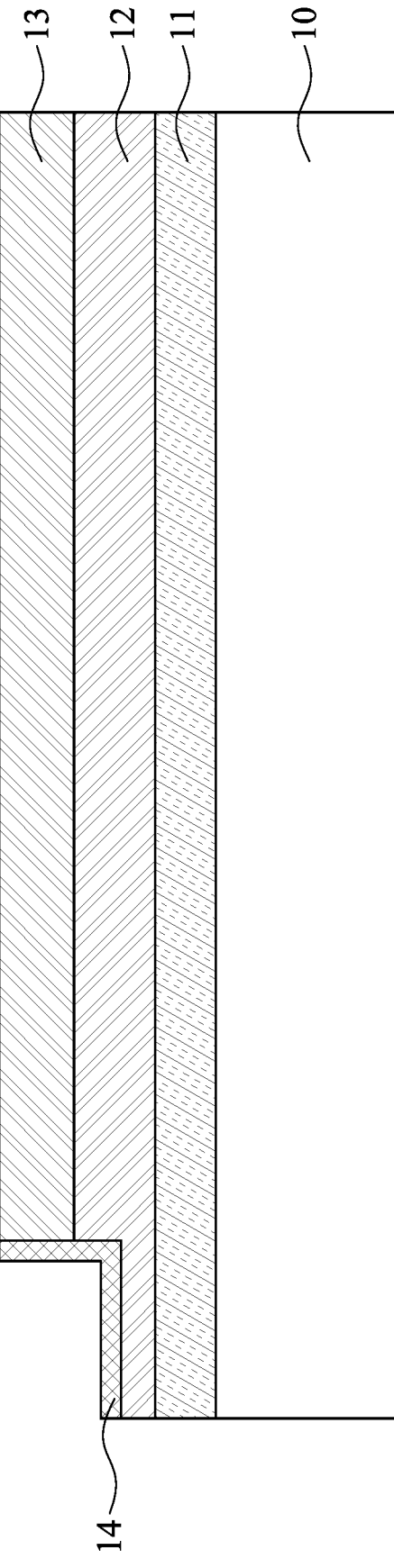

Referring to FIG. 4B, a dielectric layer 14 may be formed on the semiconductor layer 12. The dielectric layer 14 may be formed on the semiconductor layer 13. The dielectric layer 14 may be formed through a deposition step. The dielectric layer 14 may be formed on the semiconductor layer 12 through CVD and/or another suitable deposition step. The dielectric layer 14 may be formed on the semiconductor layer 13 through CVD and/or another suitable deposition step. The dielectric layer 14 may be formed to be in direct contact with the semiconductor layer 12 and the semiconductor layer 13. The dielectric layer 14 may be formed to include an L-shape structure. The dielectric layer 14 may be formed to include a step shape structure. The dielectric layer 14 may be formed on the semiconductor layer 12 conformally. The dielectric layer 14 may be formed on the semiconductor layer 13 conformally. The dielectric layer 14 may be formed on the semiconductor layer 12 and the semiconductor layer 13 conformally.

Figure 4C:
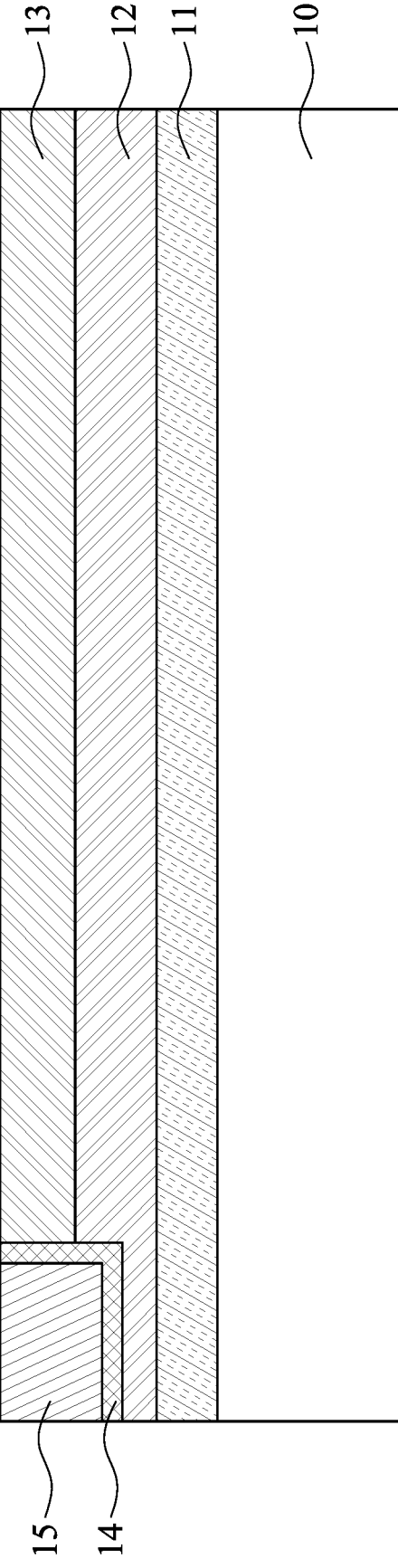

Referring to FIG. 4C, a conductive structure 15 may be formed. The conductive structure 15 may be formed through physical vapor deposition (PVD), atomic layer deposition (ALD) and/or another suitable deposition step. The conductive structure 15 may be formed on the dielectric layer 14. The conductive structure 15 may be formed on the exposed portion of the dielectric layer 14 shown in FIG. 4B. The conductive structure 15 may be formed on the dielectric layer 14 and isolated from the semiconductor layer 12. The conductive structure 15 may be formed on the dielectric layer 14 and isolated from the semiconductor layer 13. The conductive structure 15 may be formed on the dielectric layer 14 and isolated from the semiconductor layer 12 and the semiconductor layer 13. The conductive structure 15 may be formed on the dielectric layer 14 and separated from the semiconductor layer 12 by the dielectric layer 14. The conductive structure 15 may be formed on the dielectric layer 14 and separated from the semiconductor layer 13 by the dielectric layer 14. The conductive structure 15 may be formed on the dielectric layer 14 and separated from the semiconductor layer 12 and the semiconductor layer 13 by the dielectric layer 14.

Figure 4D:
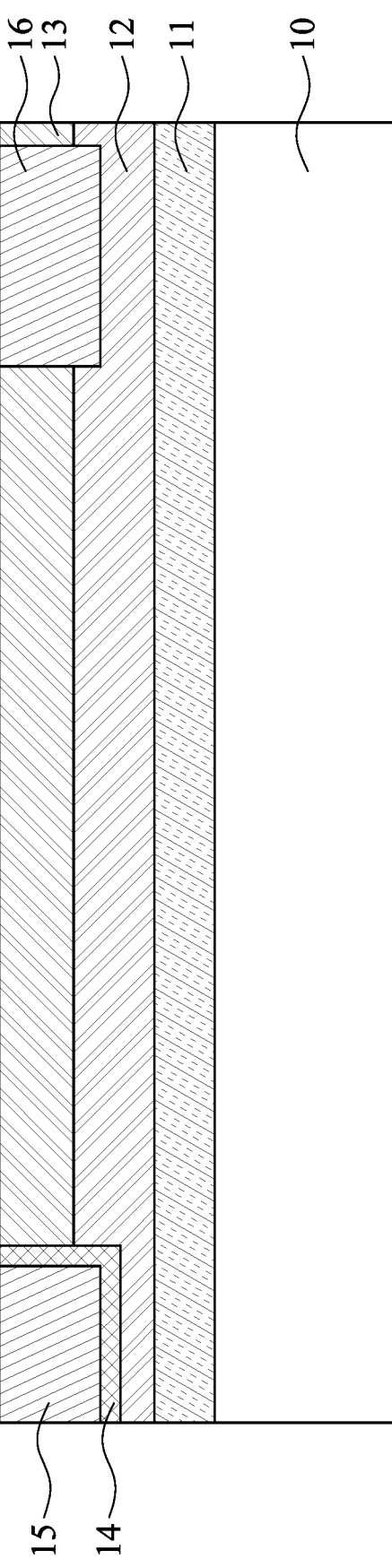

Referring to FIG. 4D, a conductive structure 16 may be formed. The conductive structure 16 may be formed through PVD, ALD and/or another suitable deposition step. The conductive structure 16 may be formed on the semiconductor layer 12. The conductive structure 16 may be formed on the semiconductor layer 12 and surrounded by the semiconductor layer 13. The conductive structure 16 may be formed on the semiconductor layer 12 and surrounded by the semiconductor layer 12 and the semiconductor layer 13.

Figure 4E:
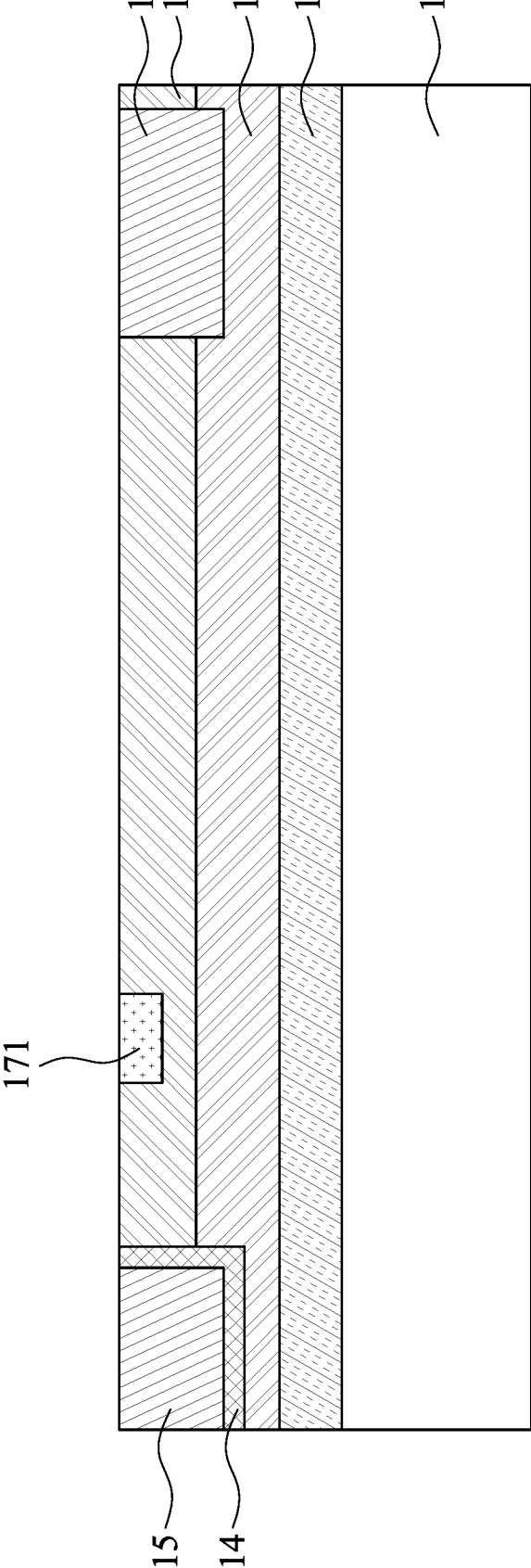

Referring to FIG. 4E, a conductive structure 171 may be formed. The conductive structure 171 may be formed through PVD, ALD and/or another suitable deposition step. The conductive structure 171 may be formed on the semiconductor layer 13. The conductive structure 171 may be formed on the semiconductor layer 13 and surrounded by the semiconductor layer 13. The conductive structure 171 may be formed between the conductive structure 15 and the conductive structure 16. The conductive structure 171 may be formed between the conductive structure 15 and the conductive structure 16 and closer to the conductive structure 15. The conductive structure 171 may be formed between the dielectric layer 14 and the conductive structure 16. The conductive structure 171 may be formed between the dielectric layer 14 and the conductive structure 16 and closer to the dielectric layer 14.

Figure 4F:
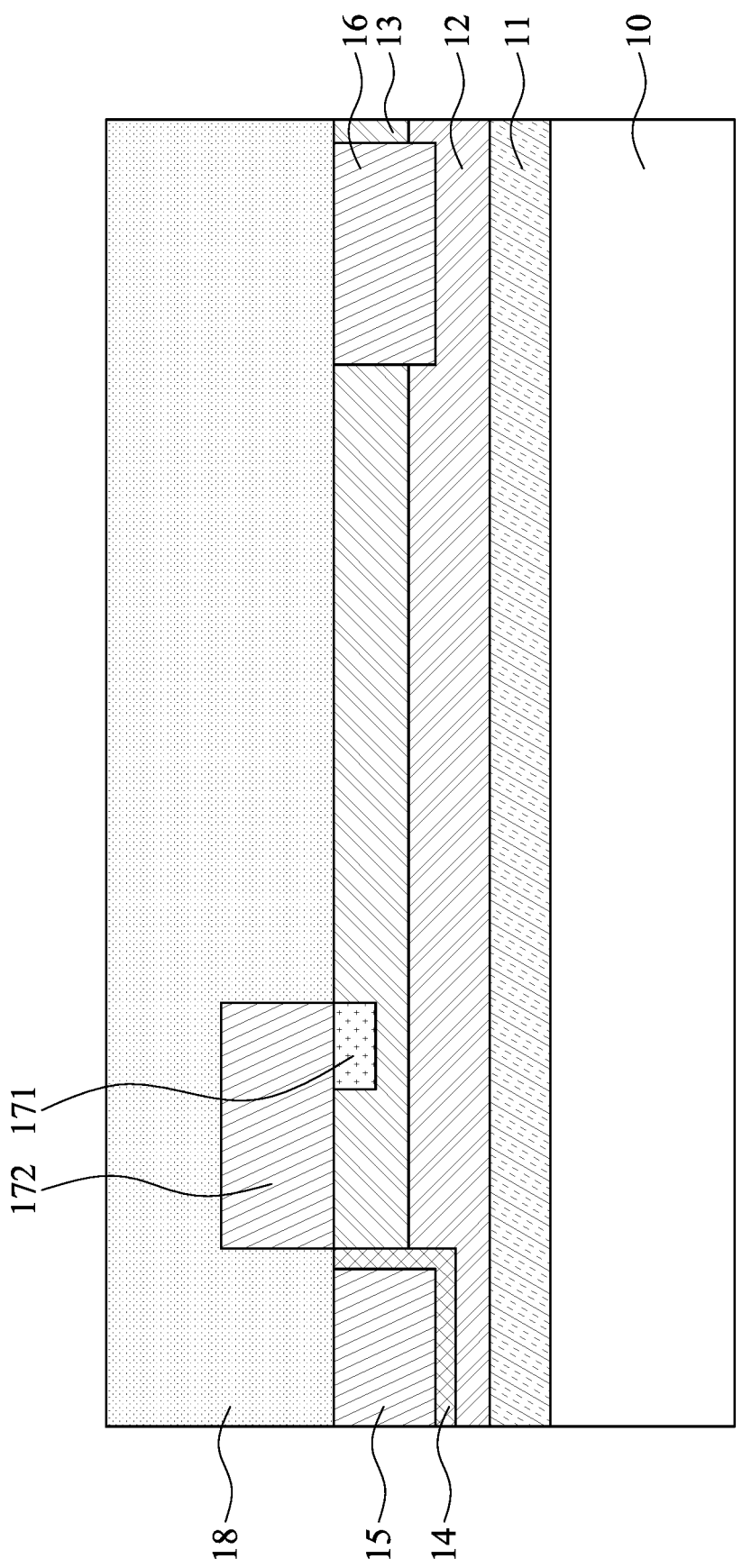

Referring to FIG. 4F, a conductive structure 172 may be formed. The conductive structure 172 may be formed through PVD, ALD and/or another suitable deposition step. The conductive structure 172 may be formed on the semiconductor layer 13. The conductive structure 172 may be formed on the conductive structure 172. The conductive structure 172 may be formed on the dielectric layer 14. The conductive structure 172 may be formed to cover the conductive structure 171. The conductive structure 172 may be formed to fully cover the conductive structure 171. The conductive structure 172 may be formed to partially cover the conductive structure 171. The conductive structure 172 may be formed to partially cover the dielectric layer 14. The conductive structure 172 may be formed between the conductive structure 15 and the conductive structure 16. The conductive structure 172 may be formed between the conductive structure 15 and the conductive structure 16 and closer to the conductive structure 15. The conductive structure 172 may be formed between the dielectric layer 14 and the conductive structure 16. The conductive structure 172 may be formed between the dielectric layer 14 and the conductive structure 16 and closer to the dielectric layer 14. The conductive structure 172 may be formed to be in direct contact with the conductive structure 171.

Also referring to FIG. 4F, a passivation layer 18 may be formed. The passivation layer 18 may be formed through CVD and/or another suitable deposition step. The passivation layer 18 may be formed on the semiconductor layer 13 through CVD and/or another suitable deposition step. The passivation layer 18 may be formed on the dielectric layer 14 through CVD and/or another suitable deposition step. The passivation layer 18 may be formed on the conductive structure 15 through CVD and/or another suitable deposition step. The passivation layer 18 may be formed on the conductive structure 16 through CVD and/or another suitable deposition step. The passivation layer 18 may be formed on the conductive structure 171 through CVD and/or another suitable deposition step. The passivation layer 18 may be formed on the conductive structure 172 through CVD and/or another suitable deposition step. The passivation layer 18 may be formed to surround the conductive structure 172.

As used herein, for ease of description, space-related terms such as "under", "below", "over", "above", "upper portion", "lower portion", "left side", "right side", and the like may be used herein to describe a relationship between one component or feature and another component or feature as shown in the figures. In addition to orientations shown in the figures, space-related terms are intended to encompass different orientations of the device in use or operation. A device may be oriented in other ways (rotated 90 degrees or at other orientations), and the space-related descriptors used herein may also be used for explanation accordingly. It should be understood that when a component is "connected" or "coupled" to another component, the component may be directly connected to or coupled to another component, or an intermediate component may exist.

As used herein, terms "approximately", "basically", "substantially", and "about" are used for describing and considering a small variation. When being used in combination with an event or circumstance, the term may refer to a case in which the event or circumstance occurs precisely, and a case in which the event or circumstance occurs approximately. As used herein with respect to a given value or range, the term "about" generally means in the range of ±10%, ±5%, ±1%, or ±0.5% of the given value or range. The range may be indicated herein as from one endpoint to another endpoint or between two endpoints. Unless otherwise specified, all the ranges disclosed in the disclosure include endpoints. The term "substantially coplanar" may refer to two surfaces within a few micrometers (μm) positioned along the same plane, for example, within 10 μm, within 5 μm, within 1 μm, or within 0.5 μm located along the same plane. When reference is made to "substantially" the same numerical value or characteristic, the term may refer to a value within +10%, +5%, +1%, or +0.5% of the average of the values.

Several embodiments of the disclosure and features of details are briefly described above. The embodiments described in the disclosure may be easily used as a basis for designing or modifying other processes and structures for realizing the same or similar objectives and/or obtaining the same or similar advantages introduced in the embodiments of the disclosure. Such equivalent constructions do not depart from the spirit and scope of the disclosure, and various variations, replacements, and modifications can be made without departing from the spirit and scope of the disclosure.

What is claimed is:

1. A semiconductor device, comprising:
   a substrate;
   a first nitride semiconductor layer on the substrate;
   a second nitride semiconductor layer on the first nitride semiconductor layer and having a band gap greater than a band gap of the first nitride semiconductor layer;
   a dielectric layer disposed on the first nitride semiconductor layer and in direct contact with the first nitride semiconductor layer and the second nitride semiconductor layer;
   a gate electrode separated from the first nitride semiconductor layer and the second nitride semiconductor layer by the dielectric layer;
   a first conductive contact disposed on the first nitride semiconductor layer;
   a second conductive contact disposed on the second nitride semiconductor layer; and
   a third conductive contact surrounded by the second nitride semiconductor layer, wherein at least a part of the third conductive contact is overlaid by the second conductive contact,
   wherein the second conductive contact is formed between the gate electrode and the first conductive contact.

2. The semiconductor device according to claim 1, wherein the third conductive contact and the second nitride semiconductor layer form a Schottky diode.

3. The semiconductor device according to claim 1, wherein the third conductive contact is in direct contact with the second nitride semiconductor layer.

4. The semiconductor device according to claim 1, wherein the second nitride semiconductor layer has a first thickness between the first nitride semiconductor layer and the third conductive contact, and wherein the first thickness ranges between approximately 10 nm and approximately 15 nm.

5. The semiconductor device according to claim 4, wherein the third conductive contact has a second thickness, and wherein the first thickness is smaller than the second thickness.

6. The semiconductor device according to claim 1, wherein a sidewall of the third conductive contact is aligned with a sidewall of the second conductive contact.

7. The semiconductor device according to claim 1, wherein the third conductive contact includes: at least one of titanium (Ti), titanium nitride (TiN), and aluminum nitride (AlN).

8. The semiconductor device according to claim 1, wherein the third conductive contact includes a substantially cuboid structure.

9. The semiconductor device according to claim 1, wherein a current flows from the second conductive contact to the first conductive contact via the third conductive contact, the second nitride semiconductor layer, and the first nitride semiconductor layer when a positive voltage is applied to the second conductive contact and no bias is applied to the first conductive contact or the gate electrode.

10. The semiconductor device according to claim 1, wherein the dielectric layer includes high-k dielectric material for depleting 2DEG in the first nitride semiconductor layer and adjacent to the dielectric layer.

11. The semiconductor device according to claim 1, wherein the dielectric layer includes $HfO_2$.

12. The semiconductor device according to claim 1, wherein a sidewall of the second conductive contact is aligned with a sidewall of the second nitride semiconductor layer.

13. The semiconductor device according to claim 1, wherein a current flows from the first conductive contact to the second conductive contact via the first nitride semiconductor layer and the second nitride semiconductor layer when a gate voltage greater than a threshold voltage is applied to the gate electrode and a positive voltage is applied to the first conductive contact, and no bias is applied to the second conductive contact.

14. The semiconductor device according to claim 1, wherein at least another part of the third conductive contact is not overlaid by the second conductive contact.

* * * * *